(12) United States Patent
Hiruma et al.

(10) Patent No.: US 7,169,461 B2
(45) Date of Patent: Jan. 30, 2007

(54) LAMINATE, A SUBSTRATE WITH WIRES, AN ORGANIC EL DISPLAY ELEMENT, A CONNECTION TERMINAL FOR THE ORGANIC EL DISPLAY ELEMENT AND A METHOD FOR PRODUCING EACH

(75) Inventors: Takehiko Hiruma, Yamagata (JP); Yasuhiko Akao, Yamagata (JP); Teruo Fujiwara, Yamagata (JP); Nobuhiro Nakamura, Kanagawa (JP)

(73) Assignee: Asahi Glass Company, Limited, Tokyo (JP)

( * ) Notice: Subject to any disclaimer, the term of this patent is extended or adjusted under 35 U.S.C. 154(b) by 77 days.

(21) Appl. No.: 10/682,719

(22) Filed: Oct. 10, 2003

(65) Prior Publication Data
US 2005/0008894 A1  Jan. 13, 2005

(30) Foreign Application Priority Data
Oct. 17, 2002  (JP) ............................. 2002-303278

(51) Int. Cl.
*B32B 9/00*  (2006.01)
*H01L 51/50*  (2006.01)

(52) U.S. Cl. ...................... 428/209; 428/690; 428/917; 427/66; 313/504; 313/506

(58) Field of Classification Search ............... 428/209, 428/690, 917; 427/66; 313/504, 506
See application file for complete search history.

(56) References Cited

U.S. PATENT DOCUMENTS 4,401,529 A * 8/1983 Gray .......................... 205/639
5,820,996 A    10/1998 Hirai et al.
6,008,869 A * 12/1999 Oana et al. ................... 349/43
6,307,317 B1   10/2001 Codama et al.
2002/0011783 A1   1/2002 Hosokawa

FOREIGN PATENT DOCUMENTS

| JP | 11-317292   | 11/1999 |
|----|-------------|---------|
| JP | 11-329750   | 11/1999 |
| JP | 2001-311954 | 11/2001 |
| JP | 2001-351778 | 12/2001 |

OTHER PUBLICATIONS

JP 74040384 B, published Nov. 1, 1974, DERWENT abstract.*
C. W. Tang, et al., "Organic electroluminescent diodes", Appl. Phys. Lett., vol. 51, No. 12, Sep. 21, 1987, pp. 913-915.
Kiyotake Naraoka, et al., "Photoetching and Microfabrication", Sogo Denshi Shuppansha, May 10, 1997, pp. 82-83 (with partial English translation).

* cited by examiner

*Primary Examiner*—Dawn Garrett
(74) *Attorney, Agent, or Firm*—Oblon, Spivak, McClelland, Maier & Neustadt, P.C.

(57) ABSTRACT

A laminate for forming a substrate with wires, comprising a conductive layer containing Al or an Al alloy as the major component, formed on a substrate and a capping layer containing a Ni—Mo alloy as the major component, formed on the conductive layer, a substrate with wires produced by etching the laminate to remove an unnecessary metal, and a method for producing the same.

27 Claims, 27 Drawing Sheets
(2 of 27 Drawing Sheet(s) Filed in Color)

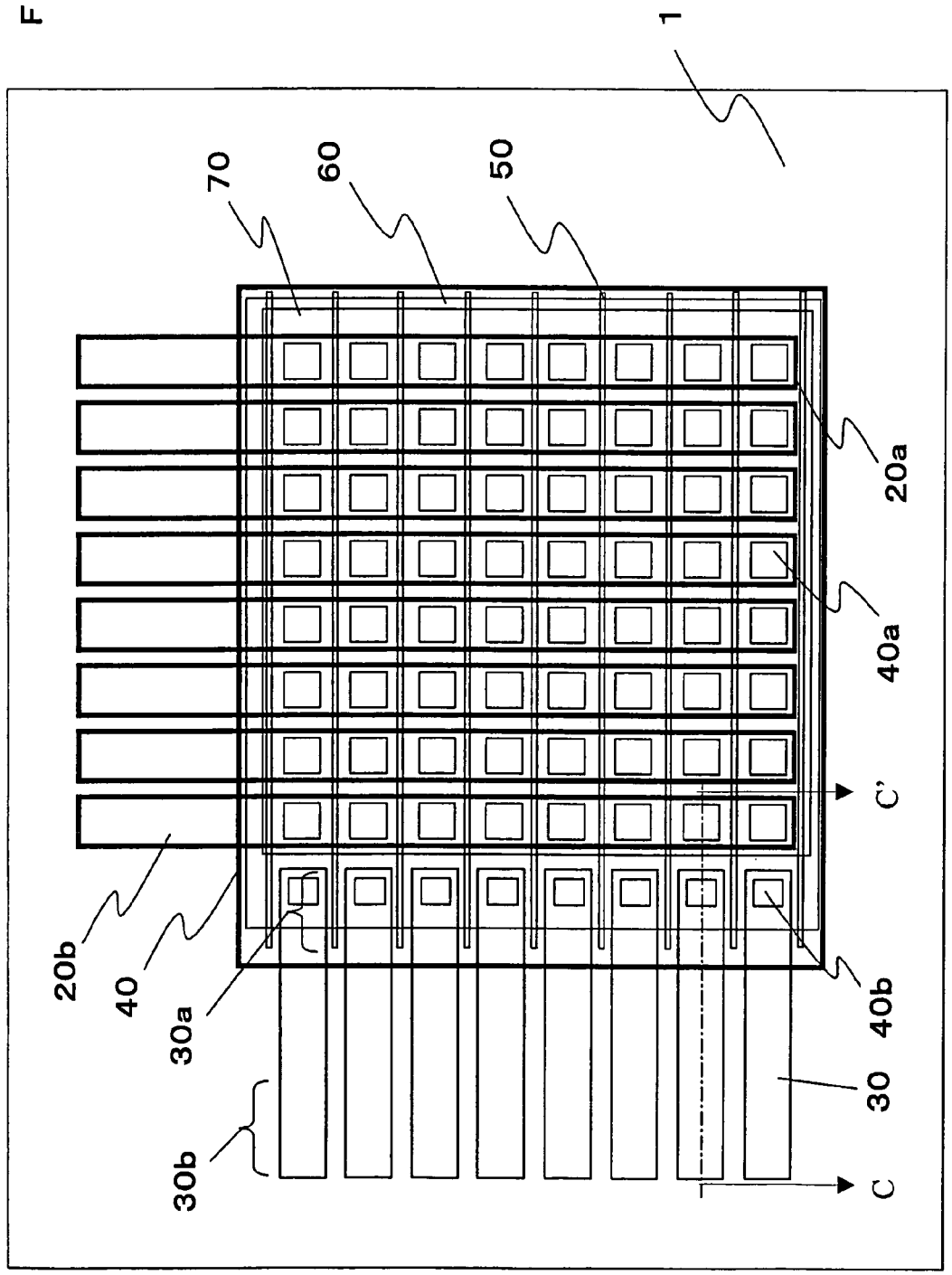

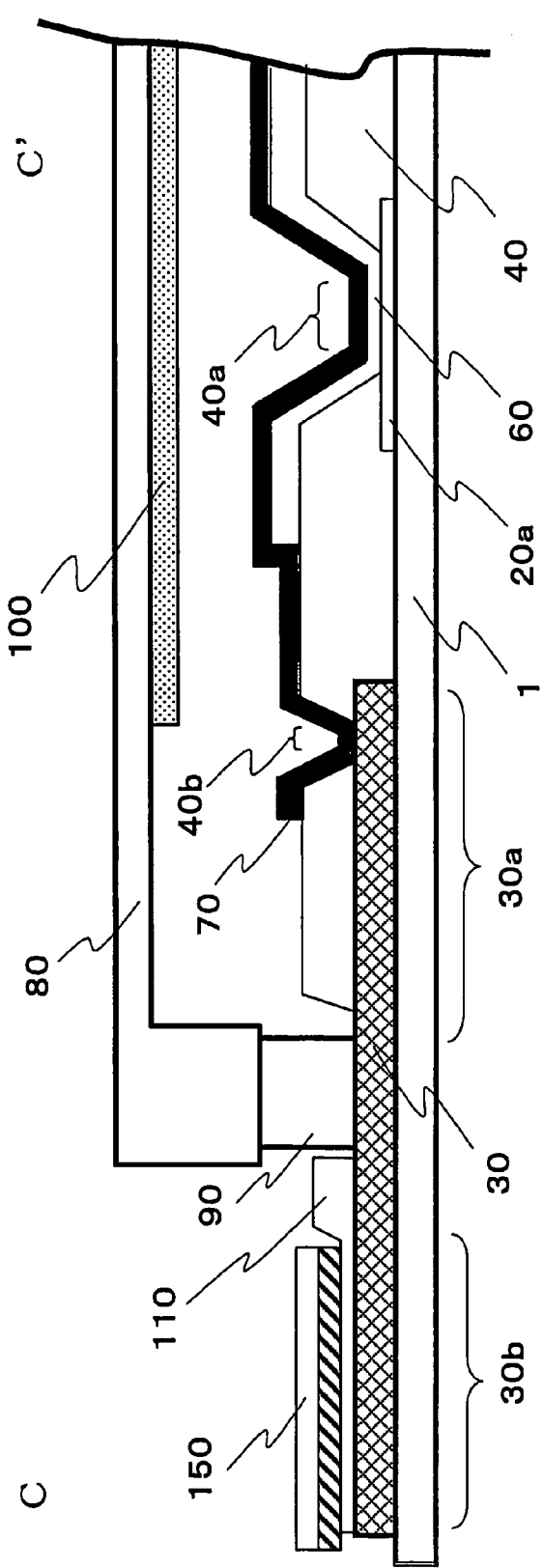

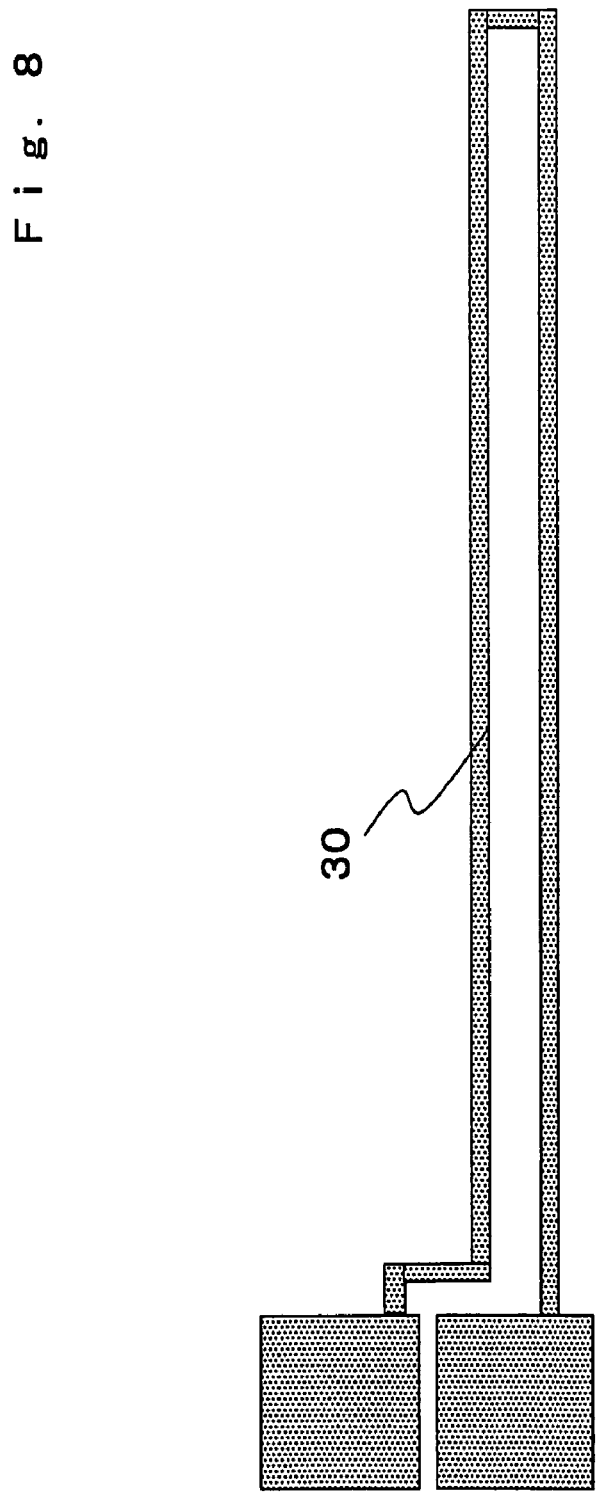

200μm

200μm

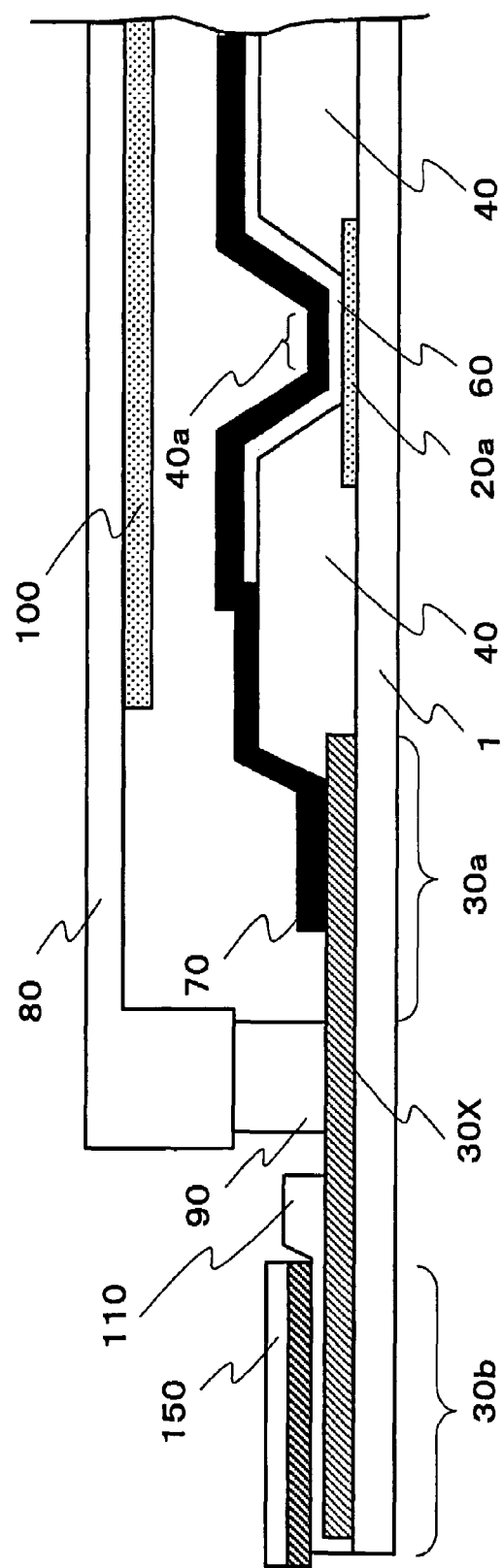

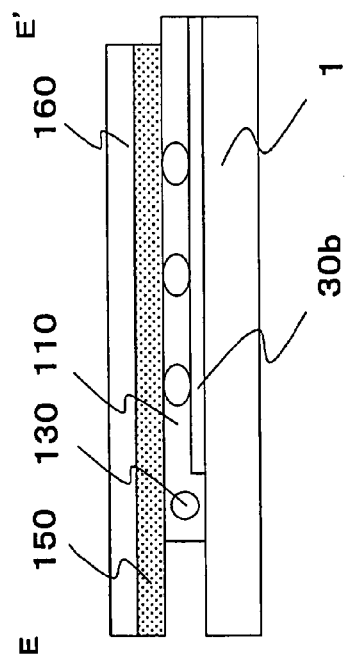
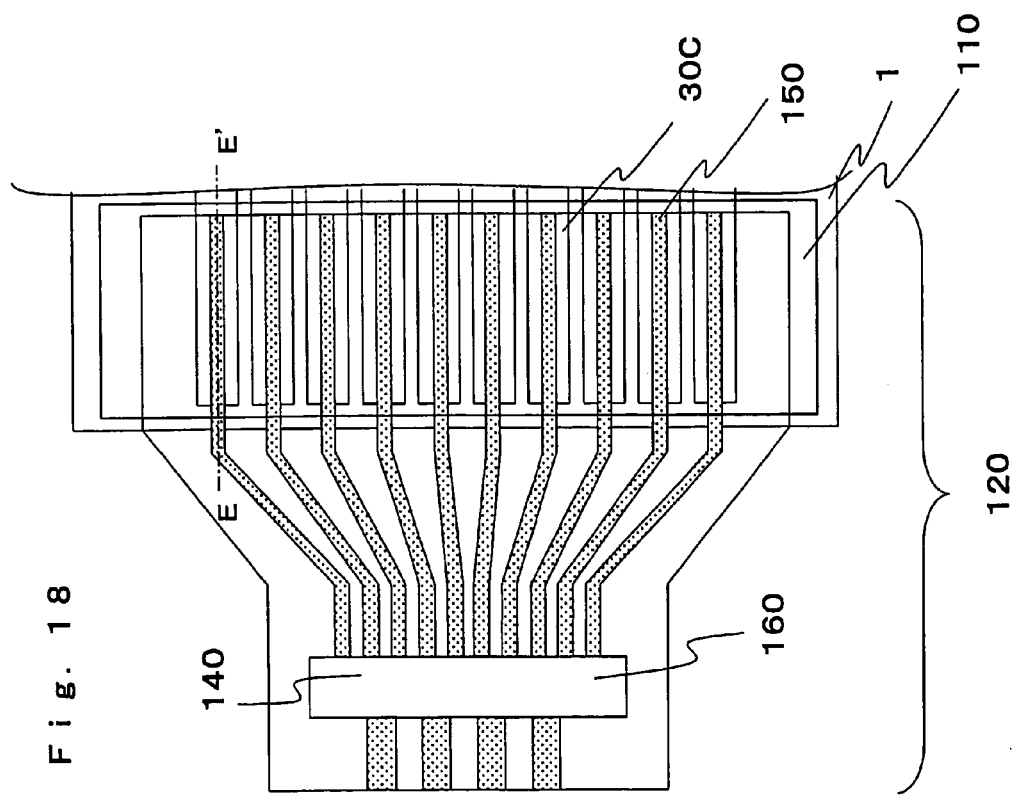

LAMINATE, A SUBSTRATE WITH WIRES, AN ORGANIC EL DISPLAY ELEMENT, A CONNECTION TERMINAL FOR THE ORGANIC EL DISPLAY ELEMENT AND A METHOD FOR PRODUCING EACH

CROSS-REFERENCE TO RELATED APPLICATIONS

The entire disclosure of Japanese Patent Application No. 2002-303278 filed on Oct. 17, 2002, including specification, claims, drawings and summary are incorporated herein by reference in their entirety.

BACKGROUND OF THE INVENTION

1. Field of the Invention

The present invention relates to a laminate, a substrate with wires, an organic EL display element, a connection terminal for the organic EL display element and a method for producing each.

2. Discussion of Background

As a flat panel display element (FPD) for coming generation, an organic EL display element has come into use for a cellular phone or the like. The organic EL display element comprises an organic luminescent material wherein a display takes place by its self-luminescence. Accordingly, it is more advantageous than conventional LCD or PDP in terms of quick response, visibility, luminance and so on.

The basic structure and the principle of operation are described in, for instance, "Appl. Phys. Lett., 51, 913 (1987). In order to cause luminescence, it has opposing electrodes at least one of which is a transparent electrode (made of, for instance, a tin-doped indium oxide (ITO)) and organic layers such as a hole transport layer, a light emission layer, an electron transport layer and so on are provided in this order from an anode side, between the opposing electrodes. Further research has been carried out so as to prolong the lifetime of the organic EL display element, to achieve an increased luminance, a full-colored display and so on.

The organic EL display element belongs to a current-driving type display. Particularly, in a passive-driving type organic EL display element, a current is supplied to it in only a selection period for each row, whereby the light emission layer emits light in response to this so that a display takes place. As a result, a large current flows into the electrodes unlike a case of using a voltage-driving type LCD.

For example, it is assumed a case that a panel having a pixel size of 300 μm×300 μm and 100 anodes is driven at a duty ratio of 1/64. The total amount of the current flowing into cathodes in a selection period is 172.8 mA in order to operate it at a luminous efficiency of 1 cd/A and an average luminance of 300 cd/m$^2$.

With demands of a full-colored display and a high definition display in the flat panel display (FPD) in recent years, it is desired for the transparent electrode to have a further low resistance. However, reduction in the resistance of ITO used conventionally for LCD or the like approaches the limit. Accordingly, a low resistance wiring technique combining a metal having a low resistance with ITO, used widely in TFT-LCD and so on, has been introduced.

Thus, it is necessary to use the low resistance wiring technique for controlling voltage increase due to a large current between the cathode and the connection terminal in the organic EL display element. Generally, a structure that supplementary wires are provided between cathodes and connection terminals so that a current flows to the connection terminals through the supplementary wires, is adopted.

However, there are very strong demands to increase the size, precision and luminance of the display panel. In order to achieve these demands, it is necessary to reduce further resistances of the supplementary wires. As a low resistance wiring material for FPD, Al or an Al alloy is generally used. However, hillocks are apt to occur in using Al or the Al alloy, and an Al oxide is easily produced on its surface. Further, even when such material is electrically connected to another metal, the contact resistance is high and accordingly, it is difficult to use such material as it is.

Therefore, a technique that Al or an Al alloy is capped with Mo or a Mo alloy (an alloy of Mo and Cr, Ti, Ta, Zr, Hf or V) is often adopted (see for example, JP-A-13-311954 as a prior art document 1) because Mo can be etched with the same etching liquid as for Al. Accordingly, when a combination of Mo and Al is used, Al and Mo can be patterned together in a photolithographic process to form a display panel.

However, since the humidity resistance of Mo is generally low and it is easily corroded due to moisture in air, there was a problem that when Mo was used as a wiring material for FPD, the wire portions were apt to deteriorate. On the other hand, when Al was capped with Cr having a high humidity resistance, it could not be etched with the same etching liquid as for Al and therefore, there was difficulty in patterning both materials together in a manufacturing process.

Further, since Ni has a high humidity resistance, the resistance does not show a substantial change even when it is left under a high moisture condition. However, Ni can not actually be etched when a certain kind of etching liquid (comprising phosphoric acid:nitric acid:acetic acid and water=16:1:2:1 (in volume ratio)) is used. ("Photoetching and Microfabrication" by Kiyotake Naraoka and one other, published by Sogo Denshi Shuppansha (on May 10, 1977), p.82–p.83).

Further, since Ni is a ferromagnetic material, it is difficult to use a magnetron sputtering method as a generally used thin film forming method. Accordingly, it is difficult to use a thin Ni film as a wiring material for FPD.

Further, in the organic EL display element, the contact between a cathode and a supplementary wire and lowering of the resistance of a connection terminal to a supplementary wire create new problems. In particular, it is necessary for the contact characteristics between the cathode and the supplementary wire to have not only low resistance characteristics but also being stable against the Joule heat generated at the contact portion depending on the magnitude of an electric current flowing there.

Namely, the difficulty of increasing the contact resistance by the Joule heat is required. The increase of the contact resistance by the Joule heat is considered to be due to the oxidation of the metal used for the supplementary wire or the like.

FIG. 17 is a cross-sectional view partly omitted of an organic EL display element prepared according to a conventional technique. An anode 20a is formed on a transparent substrate 1 made of glass or the like. An electrode disposed inside the element and a driving circuit are connected with a supplementary wire 30×comprising a connection-terminal-side pattern portion 30b and an inner side pattern portion 30a. A cathode 70 is connected electrically to a connecting wire 150 at an outer side by means of the supplementary wire 30X. An organic EL layer 60 emits light by supplying a current between the anode 20a and the cathode 70. A counter substrate 80 is provided to seal the organic EL layer 60 and so on.

An insulation film 40 serves to define an opening region 40a where the organic EL layer 60 and the anode 20a contact. In such structure, generally, ITO (indium oxide-tin oxide) is used for the anode 20a, and an easily oxidizable metal such as Al, Mg, Ag or the like is used for the cathode. Metal such as Cr or the like is used for the supplementary wire.

When a patterned Cr having a film thickness of 300 nm, a width of 150 μm, a length of 4 mm and a specific resistance of 20 μΩ cm is used for the supplementary wire, the resistance is 17.7 Ω. In this case, when the above-mentioned current is supplied, a voltage drop of about 0.3.1 V takes place in response to the resistance of the wire, whereby there is a voltage increase beyond the predetermined electric potential.

Further, as shown in FIG. 17, an oxidized layer is formed on the surface of the supplementary wire 30×with processes of manufacturing, and accordingly, the contact resistance between the cathode 70 and the supplementary wire 30×increases to thereby increase a voltage in these members. The voltage rise is considered to cause adverse effects such as an uneven display at the time of gradation display and an increase in the breakdown of an anode driver used.

Explanation will be made as to a supplementary wiring technique described in JP-A-11-317292 (a prior art document 2). The prior art document 2 is characterized in that a transparent electrode material is used for a connection terminal connectable to a driving circuit, and the same material is used for a cathode and a supplementary wire. In this case, there would arise no problem about the contact resistance between the cathode and the supplementary wire unless surfaces of the cathode and the supplementary wire are oxidized before the connection of the cathode to the supplementary wire.

However, an easily oxidizable material is generally used for the cathode of an organic EL display element. Therefore, when the material for the supplementary wire is used also for the cathode, there occurs a problem that the surface of supplementary wire is oxidized during the manufacture of the organic EL display element and the contact resistance to the cathode becomes high. In particular, the increase of the contact resistance is remarkable when it is kept at a high temperature. When Al or an Al alloy is applied to the cathode or the supplementary wire, the contact resistance increases remarkably when it is kept at about 100° C.

JP-A-11-329750 (a prior art document 3) discloses a technique of reducing the contact resistance between a cathode and a supplementary wire. According to the proposal of the prior art document 3, low-resistance contact characteristics can be obtained by forming a supplementary wire portion into two portions: an undercoat pattern and an electrode pattern, and TiN or Cr is used for the undercoat pattern and Al is used for the electrode pattern to bring the supplementary wire portion into contact with the cathode.

In the prior art document 3, however, it is necessary to conduct a photolithographic process twice in order to form the supplementary wire portion. Further, in order to use TiN as a material for wiring, it is necessary to apply dry etching for the patterning which causes a problem of productivity. Further, in the case of using Cr for the undercoat pattern, the contact resistance may become extremely high when it is left at a high temperature of about 100° C. even though the initial contact characteristics are excellent.

In the organic EL display element, a large current should be supplied to the electrodes, and it is desirable to use a metal having low resistance characteristics is used to connect the cathode as described above. It is desirable that the connection terminal has excellent weather resistance characteristics, particularly, humidity resistance characteristics because it is not disposed in the sealed element but it is exposed in the environment.

Thus, when the material for the supplementary wire is used for the organic EL display element, there is a requirement of not only having excellent contact characteristics to the cathode but also being capable of suppressing corrosion due to moisture as possible because the material is extended from the sealed display panel to the outside of it.

The present invention is to provide a laminate applicable to an organic EL display element. It can form a substrate with wires having excellent humidity resistance, and it provides also a low resistance and an excellent patterning performance. Further, it is an object of the present invention to provide a substrate with wires formed by using the laminate.

In particular, the present invention is to provide a method for producing a substrate with wires by forming a laminate suitable for FPD such as an organic EL display element and etching the laminate two dimensionally, and to provide a substrate with wire formed by using the method.

Further, the present invention is to provide a circuit structure exhibiting excellent low resistance characteristics at a contact region constituting the circuit when a driving current is supplied to an organic EL display element to cause light emission.

Further, the present-invention is to maintain low resistance contact characteristics to the electrodes to which a large current is supplied and to realize reliable contact characteristics. Further, the present invention is to provide an organic EL display element of high reliability wherein the corrosion resistance of a metal constituting the electrodes and wires is improved.

SUMMARY OF THE INVENTION

According to an Embodiment 1 of the present invention, there is provided a laminate for forming a substrate with wires, which comprises a substrate, a first conductive layer containing Al or an Al alloy as the major component, formed on the substrate, and a capping layer containing a Ni—Mo alloy as the major component, formed on the first conductive layer.

According to an Embodiment 2, there is provided the laminate according to the Embodiment 1, wherein between the first conductive layer and the substrate, an ITO layer and an underlayer are arranged in this order from the side of the substrate.

According to an Embodiment 3, there is provided the laminate according to the Embodiment 2, wherein the major component of the underlayer is Mo or a Mo alloy.

According to an Embodiment 4, there is provided the laminate according to the Embodiment 2 or 3, wherein the underlayer contains NiMo as the major component and contains one member selected from the group consisting of oxygen, nitrogen, oxygen and nitrogen, oxygen and carbon, and oxygen, nitrogen and carbon.

According to an Embodiment 5, there is provided the laminate according to the Embodiment 2, 3 or 4, wherein the content of Ni in the underlayer is 20–90 mass % based on the all components and the content of Mo is 10–80 mass % based on the all components.

According to an Embodiment 6, there is provided the laminate according to the Embodiment 1, 2, 3, 4 or 5, wherein an anti-Ni-diffusion layer without containing Ni is formed between the first conductive layer and the capping layer.

According to an Embodiment 7, there is provided the laminate according to the Embodiment 6, wherein the anti-Ni-diffusion layer contains Mo as the major component and does not contain Ni.

According to an Embodiment 8, there is provided the laminate according to the Embodiment 6 or 7, wherein the anti-Ni-diffusion layer comprises MoNb, MoTa, MoV or MoW.

According to an Embodiment 9, there is provided the laminate according to the Embodiment 6, 7 or 8, wherein the conductive material in the anti-Ni-diffusion layer contains Mo, Nb or Ta, the content of Mo is 80–98 mass % and the content of Nb or Ta is 2–20 mass %.

According to an Embodiment 10, there is provided the laminate according to any one of Embodiments 1 to 9, wherein the capping layer contains one member selected from the group consisting of oxygen, nitrogen, oxygen and nitrogen, oxygen and carbon, and oxygen, nitrogen and carbon.

According to an Embodiment 11, there is provided the laminate according to any one of Embodiments 1 to 10, wherein the content of Ni in the capping layer is 20–90 mass % based on the all components and the content of Mo is 10–80 mass % based on the all components.

According to an Embodiment 12, there is provided an organic EL display element comprising a laminate described in any one of Embodiments 1 to 11, wherein a second electrode layer is provided on the substrate so as to face a first electrode layer, an organic EL layer is disposed between the first electrode layer and the second electrode layer, and the substrate, the first conductive layer and the capping layer are arranged in this order from the side of the substrate.

According to an Embodiment 13, there is provided an organic EL display element comprising, a first electrode layer and a second electrode layer facing the first electrode layer, formed on the substrate, and an organic EL layer disposed between the first electrode layer and the second electrode layer, wherein a first conductive layer is connected electrically to the first electrode layer, a capping layer is formed on an upper side of the first conductive layer, the major component of the first conductive layer is Al or an Al alloy, and the major component of the capping layer is a Ni—Mo alloy.

According to an Embodiment 14, there is provided the organic EL display element according to the Embodiment 13, wherein the capping layer contains one member selected from the group consisting of oxygen, nitrogen, oxygen and nitrogen, oxygen and carbon, and oxygen, nitrogen and carbon.

According to an Embodiment 15, there is provided the organic EL display element according to the Embodiment 13 or 14, wherein an anti-Ni-diffusion layer without containing Ni is formed between the first conductive layer and the capping layer.

According to an Embodiment 16, there is provided the organic EL display element according to the Embodiment 13, 14 or 15, wherein the anti-Ni-diffusion layer comprises MoNb, MoTa, MoV or MoW.

According to an Embodiment 17, there is provided the organic EL display element according to the Embodiment 13, 14, 15 or 16, wherein an underlayer containing Mo or a Mo alloy is provided under the first conductive layer.

According to an Embodiment 18, there is provided the organic EL display element according to any one of Embodiments 13 to 17, wherein the second electrode layer is an ITO layer.

According to an Embodiment 19, there is provided a connection terminal for an organic EL display element, to connect a first electrode layer provided on the substrate for the organic EL display element to a driving circuit, the connection terminal comprising a first conductive layer containing Al or an Al alloy as the major component and a capping layer containing a Ni—Mo alloy as the major component, which is formed at an upper side of the first conductive layer, and a circuit to supply an electric current from the driving circuit to the first electrode layer.

According to an Embodiment 20, there is provided the connection terminal for an organic EL display element according to the Embodiment 19, wherein the capping layer contains one member selected from the group consisting of oxygen, nitrogen, oxygen and nitrogen, oxygen and carbon, and oxygen, nitrogen and carbon.

According to an Embodiment 21, there is provided the connection terminal for an organic EL display element according to the Embodiment 19 or 20, wherein an anti-Ni-diffusion layer without containing Ni is formed between the first conductive layer and the capping layer.

According to an Embodiment 22, there is provided the connection terminal for an organic EL display element according to the Embodiment 19, 20 or 21, which has a circuit to supply an electric current from a plurality of second electrodes to a single first electrode, and the maximum instantaneous current flowing into the single first electrode is at least 50 mA.

According to an Embodiment 23, there is provided a method for producing the laminate described in any one of Embodiments 1 to 11, wherein the first conductive layer is formed on the substrate and then, the capping layer is formed thereon.

According to an Embodiment 24, there is provided the method for producing the laminate according to the Embodiment 23, wherein a transparent second conductive layer is formed, the formed layer is patterned and then, the first conductive layer is formed thereon.

According to an Embodiment 25, there is provided the method for producing the laminate according to the Embodiment 23 or 24, wherein in the formation of the capping layer, a process of oxidizing or nitriding, or processes of oxidizing and nitriding, oxidizing and carbonizing, nitriding and carbonizing or oxidizing, nitriding and carbonizing are carried out.

According to an Embodiment 26, there is provided a substrate with wires, which comprises the laminate described in any one of Embodiments 1 to 11 wherein the laminate is patterned in a flat form.

According to an Embodiment 27, there is provided a method for producing the connection terminal for an organic EL display element, described in the Embodiment 19, 20, 21 or 22, characterized in that a transparent second conductive layer is formed; the formed layer is patterned; a lamination layer comprising the first conductive layer and the capping layer is formed, and then, the lamination layer is patterned.

According to an Embodiment 28, there is provided a method for producing the organic EL display element described in any one of Embodiments 12 to 18, characterized in that a transparent second conductive layer is formed on the substrate and a lamination layer comprising a first conductive layer and a capping layer is formed on the substrate, the second conductive layer is used as a second electrode, and the lamination layer is patterned so that the lamination layer is used as a part of wires extending from the first conductive layer to a connection terminal.

According to an Embodiment 29, there is provided the method for producing the organic EL display element according to the Embodiment 28, wherein the transparent second conductive layer is formed on the substrate, the second conductive layer is patterned to use it as the second electrode, the first conductive layer and the capping layer are formed as the lamination layer, and then, patterning is carried out to the lamination layer.

According to an Embodiment 30, there is provided an organic EL display element comprising the organic EL display element described in any one of Embodiments 12 to 18 and a driving circuit connected to the display element so that a display is provided at a luminance of at least 100 cd/m$^2$.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 6 is a plan view showing an Embodiment of the organic EL display element according to the present invention.

FIG. 7 is a cross-sectional view partly omitted taken along a C–C' cutting-plane line in FIG. 6.

FIG. 8 is a plan view of TEG for evaluating a wire resistance.

FIG. 17 is a cross-sectional view of a cathode contact portion of the organic EL display element prepared according to the conventional technique.

FIG. 18 is a plan view of a terminal portion with TCP.

FIG. 19 is a cross-sectional view of the part taken along a E–E' cutting-plane line in FIG. 18.

DESCRIPTION OF THE PREFERRED EMBODIMENTS

Figure 1:
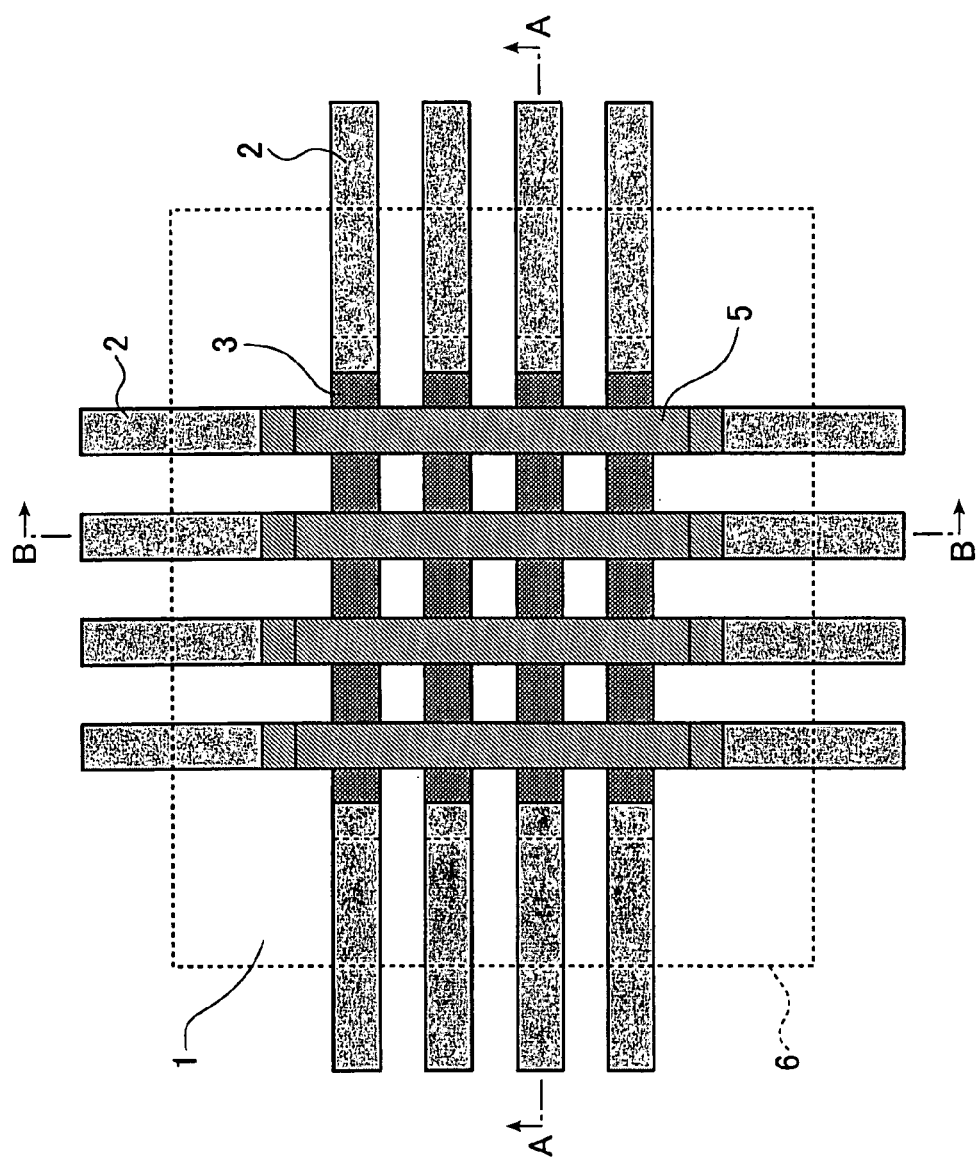
FIG. 1 is a front view partly omitted showing an Embodiment of a substrate with wires formed by using the laminate of the present invention.

In the following, some practical embodiments of the present invention will be described with reference to drawings, Examples and so on. However, these drawings and Examples show exemplification of the present invention and they do not limit the scope of the present invention. Of course, another practical embodiment belongs to the present invention as long as it meets the spirit of the present invention.

The substrate used in the present invention is not necessarily in a flat plate-like shape but may have a curved plane or a different shape. As the substrate, there are a transparent or opaque glass substrate, a ceramic substrate, a plastic substrate, a metal substrate and so on.

When the substrate is used for an organic EL display element having a structure that emission of light is caused from a substrate side, it is preferable that the substrate is transparent. In particular, the substrate is preferably a glass substrate from viewpoints of strength and heat resistance. As the glass substrate, a transparent colorless soda lime glass substrate, quartz glass substrate, borosilicate glass substrate and non-alkali glass substrate can be mentioned. As the glass substrate used for the organic EL display element, it preferably has a thickness of 0.2–1.5 mm from viewpoints of strength and transmittance.

The laminate for forming a substrate with wires according to the present invention is a laminate of at least two layers comprising essentially a conductive layer containing Al or an Al alloy (hereinbelow, it may be referred to as the Al series metal) as the major component, formed on the substrate and a capping layer containing Ni—Mo as the major component, formed on the conductive layer. Since the conductive layer is the Al series metal, low-resistivitization of wires can be achieved. In particular, an Al—Nd alloy is preferable since hillocks of Al can be prevented while it can keep low resistance characteristics. The Al alloy is an alloy of Al and a metal such as Nd, Ag, Cu or the like, which is of little risk in increasing the resistance of the wires.

The Al series metal layer may contain Ti, Mn, Si, Cu, Na or O as impurities, and it is preferable that the content of impurities is 1 mass % or less in total. The content of Al in the Al alloy layer is preferably 80–100 mass %, more preferably, 90–100 mass % from the viewpoint of reducing the resistance of the wires. The film thickness of the conductive layer is preferably 100–500 nm, more preferably, 100–400 nm, further preferably, 150–400 nm, particularly preferably, 150–300 nm so that a sufficient conductivity and excellent feasibility of patterning can be obtained.

The capping layer formed on the conductive layer is a layer containing a Ni—Mo alloy as the major component. Since the Ni—Mo alloy layer is excellent in humidity resistance, the capping layer can reduce the resistance of the wires; can prevent an aluminum oxide layer from occurring on the surface of the Al series metal layer, and suppress an increase of the contact resistance.

Accordingly, reliability to an electronic device using such substrate with wires can be improved. Further, an obtainable laminate can allow precise patterning. In addition, when the Ni—Mo alloy layer undergoes patterning by a photolithographic method, the conductive layer (the Al series metal layer) and the capping layer (the Ni—Mo alloy layer) can be etched at substantially the same rate by using the same etching liquid (aqueous solution of acid). Namely, patterning can be conducted together with the conductive layer.

A large difference in the etching rate between the conductive layer and the capping layer is not preferable because over-etching or a residue is resulted during the formation of the wires. The etching rate of the Ni—Mo alloy layer can easily be adjusted by changing the proportion of composition of Ni and Mo depending on a kind of the etching liquid. When the proportion of Mo to Ni is large, the etching rate becomes higher.

The film thickness of the capping layer is preferably 10–200 nm, more preferably, 15–50 nm from viewpoints of humidity resistance and feasibility of patterning.

The content of Ni in the Ni—Mo alloy layer is preferably 20–90 mass %, more preferably, 55–75 mass %. If the content of Ni is less than 20 mass %, the humidity resistance of the Ni—Mo alloy layer is insufficient, and if it exceeds 90 mass %, the etching rate by the etching liquid is low and it is difficult to adjust it to the same rate as for the conductive layer. Further, the content of Mo in the Ni—Mo alloy layer is preferably 10–80 mass %, more preferably, 20–40 mass %.

If the content of Mo is less than 10 mass %, the etching rate by the etching liquid is low and it is difficult to adjust it to the same rate as the conductive layer. If it exceeds 80 mass %, the humidity resistance of the Ni—Mo alloy layer is insufficient. It is preferable that the total content of Ni and Mo in the Ni—Mo alloy layer is 90–100 mass %.

The Ni—Mo alloy layer may contain a kind of or at least 2 kinds of metal such as Ti, V, Cr, Fe, Co, Zr, Nb, Ta, W or the like in a range that the humidity resistance and the feasibility of etching are not deteriorated, e.g., in an amount of not more than 10 mass %.

The laminate for forming a substrate with wires of the present invention can be formed by a sputtering method. For example, it can be formed by a combined steps: a step of forming a conductive layer on a surface of a glass substrate by sputtering with an Al series metal target in an inert gas atmosphere and a step of forming a capping layer on the conductive layer by sputtering with a Ni—Mo alloy series target.

The Al series metal target is, for example, an Al metal target, an Al alloy target containing Nd, an Al non-alloy target containing Nd, or the like. The Ni—Mo alloy target is, for example, a Ni—Mo alloy target, a Ni—Mo alloy target containing Fe, a Ni—Mo non-alloy target containing Fe, or the like.

As the Ni—Mo non-alloy target containing Fe, there is such one formed by combining in a mosaic form Ni plates, Mo plates and Fe plates having smaller surface areas than the surface area of the target, or such one formed by combining a Ni—Mo alloy target plate and a Fe plate, for example. The sputtering method permits the formation of a laminate for forming a substrate with wires which has a uniform film thickness over a large surface area.

When an Al layer as the conductive layer and a Ni—Mo alloy layer as the capping layer are formed in the laminate for the substrate with wires of the present invention, the following method can be used, for example.

An Al series target and a Ni—Mo alloy series target are fixed separately to the cathode of a d.c. magnetron sputtering device, and a substrate is fixed to the substrate holder. Then, air in the deposition chamber is evacuated and an Ar gas is introduced as sputtering gas. Although He, Ne or Kr gas can be used instead of the Ar gas, the Ar gas is preferable because it provides a stable discharge and is economical. The sputtering pressure is preferably 0.1 to 2 Pa and the backpressure is preferably $1\times10^{-6}$ to $1\times10^{-2}$ Pa. The substrate temperature is preferably from the room temperature to 400° C. A higher deposition temperature is preferably because it may reduce the resistance. However, it increases the surface roughness. When it is necessary to make the surface roughness small, the substrate temperature should be lowered. The lowering of the surface roughness has an advantage that the coverage of the Ni—Mo layer formed on the Al layer becomes good.

When the Al metal layer is formed, an Al metal target may be used, and when the Al alloy layer is formed, Al and other metal for forming an alloy may be used as separate targets to form the alloy layer. However, it is preferable, from viewpoints of controllability of the composition of the conductive layer and improvement of uniformity, that an Al alloy having a predetermined composition is previously prepared and the alloy is used for the target.

First, sputtering is conducted by using the Al metal target to form an Al metal layer as the conductive layer on the substrate. Then, sputtering is conducted to the layer by using the Ni—Mo series target to form a Ni—Mo alloy layer whereby a laminate is produced.

As described above, the laminate of the present invention comprises two layers formed on the substrate as the basic structure. However, the present invention is not limited to such structure, but includes a structure having three or more layers comprising other layers as described below. It is preferable to form these other layers by a sputtering method.

The laminate of the present invention may have an anti-Ni-diffusion layer having a composition different from the capping layer, between the Ni—Mo alloy layer (the capping layer) and the Al metal layer (the conductive layer) containing Al or an Al alloy as the major component. When a heat treatment is conducted under the condition that the capping layer is in contact with the conductive layer, Ni diffuses from the capping layer to the conductive layer whereby the resistance of the conductive layer increases. The increase of the resistance can be suppressed by providing the anti-Ni-diffusion layer. It is preferable that the anti-Ni-diffusion layer is also formed by a sputtering method. In the formation of the anti-Ni-diffusion layer, it is preferable to use the same conditions (the sputtering pressure and so on) as the Al layer.

The film thickness of the anti-Ni-diffusion layer is preferably 10–200 nm from viewpoints of a barrier effect and feasibility of patterning, more preferably, 15–80 nm, particularly preferably, 15–50 nm.

It is preferable that the anti-Ni-diffusion layer comprises a Mo series metal layer containing Mo as the major component because it can be etched together with the capping layer and the conductive layer. When the Mo series metal layer is formed as the anti-Ni-diffusion layer between the conductive layer and the capping layer, Mo is exposed at a patterned cross-sectioned portion after patterning. However, there is no substantial change of the humidity resistance because the major part of the Mo series metal layer is covered with the capping layer and the conductive layer.

However, the anti-Ni-diffusion layer can contain, other than Mo, a kind or at least two kinds of metal such as Nb, Ta, V, W, Cr, Zr, Ti or the like in a range of from 2 to 20 mass % in order to improve further the humidity resistance. If it contains an element or elements in an amount of less than 2 mass %, the effect of improving the humidity resistance by the addition of element or elements is not sufficient. On the other hand, if more than 20 mass %, there is difficulty in manufacturing because the feasibility of patterning becomes worse. The content of Mo in the Mo series alloy layer containing Mo as the major component is preferably 80 to 98 mass %.

In the laminate of the present invention, the capping layer is preferably subjected to a process of oxidizing or nitriding, or processes of oxidizing and nitriding, oxidizing and carbonizing, nitriding and carbonizing or oxidizing, nitriding and carbonizing. Namely, the increase of the resistance can be prevented likewise the anti-Ni-diffusion layer by conducting such process or processes in the formation of the capping layer so that the Ni—Mo alloy layer is rendered to be an oxidized, nitrided, oxynitrided, oxycarbonized, carbonitried or oxycarbonitrided Ni—Mo alloy layer.

Such process or processes are conducted by a method using a mixed gas comprising a reactive gas such as $O_2$, $N_2$, CO, $CO_2$ or the like and an Ar gas, as sputtering gas, in the formation of the Ni—Mo alloy layer by sputtering. The content of the reactive gas is preferably 5 to 50 volume % from the viewpoint of an anti-Ni-diffusion effect, more preferably, 20 to 40 volume %.

Further, the laminate of the present invention may have a tin-doped indium oxide layer (ITO layer). In this case, there is a disadvantage that the Al series metal layer has a large contact resistance to the ITO layer. Accordingly, it is practically preferable for the laminate to have a structure comprising a capping layer/a conductive layer/an underlayer/an ITO layer/a substrate by interposing the underlayer.

The ITO layer can be used as a transparent electrode. Accordingly, after the ITO layer has been formed on the substrate in the laminate of the present invention, when a necessary portion is masked in the formation of the underlayer, the conductive layer and the capping layer, there is no underlayer, conductive layer and capping layer under the mask, and only the ITO layer exists. Thus, it can be used as the electrode. If necessary, an organic layer can be formed on the electrode to form an organic EL display element. On the other hand, since there are the underlayer, the conductive layer and the capping layer on the ITO layer in the unmasked portion, the ITO layer as the electrode can be connected to the underlayer, the conductive layer and the capping layer as wires, without any step.

The ITO layer can be formed on, for instance, a glass substrate by using an electron beam method, a sputtering method, an ion plating method or the like. The ITO layer can preferably be formed by sputtering, using an ITO target containing $SnO_2$ in 3 to 15 mass % based on the total amount of $In_2O_3$ and $SnO_2$, for instance. The sputtering gas is preferably a mixed gas of $O_2$ and Ar and the concentration of $O_2$ gas is preferably 0.2 to 2 volume %.

The film thickness of the ITO layer is preferably 50–300 nm, more preferably, 100 to 200 nm.

Then, the conductive layer and the capping layer are formed on the ITO film by sputtering to obtain the laminate for forming a substrate with wires having the ITO layer.

The conductive layer has the disadvantage of large contact resistance to the ITO layer. Accordingly, when the ITO layer is formed between the substrate and the conductive layer, the underlayer should be formed under the conductive layer in order to prevent an increase of the contact resistance between the ITO layer and wires. It is preferable that the underlayer is a layer containing Mo or a Mo alloy as the major component. The layer containing Mo or a Mo alloy as the major component means that the content of Mo or a Mo alloy in the layer is 90 to 100 mass %. Further, it is preferable to form the underlayer under the same conditions (such as sputtering pressure and so on) as the Al layer.

The film thickness of the underlayer is preferably 10 to 200 nm from viewpoints of a barrier effect and feasibility of patterning, more preferably, 15 to 50 nm.

The Ni—Mo alloy layer is preferably used as the layer containing Mo or the Mo alloy as the major component. When the Ni—Mo alloy layer is used as the underlayer, the content of Ni in the alloy layer is preferably 20 to 90 mass % in the all components, more preferably, 55 to 75 mass %. The content of Mo is preferably 10 to 80 mass % in the all components, more preferably, 20 to 40 mass %.

Further, a kind of or at least two kinds of metal such as Ti, V, Cr, Fe, Co, Zr, Nb, Ta, W and so on may be contained in an amount not to cause deterioration of the humidity resistance and feasibility of patterning, e.g., in an amount of not more than 10 mass %.

The composition of the Ni—Mo alloy layer as the underlayer formed under the conductive layer may be the same as or different from the composition of the Ni—Mo alloy layer as the capping layer. Use of the same composition allows using the same material as the target, and is advantageous in economy. When compositions of upper and lower Ni—Mo alloy layers are adjusted so that etching rates for the Ni—Mo alloy layer (capping layer), the Al series metal layer (conductive layer) and the Ni—Mo alloy layer (underlayer) are increased in this order, the patterned portion can be processed in a taper-like form in cross section. It is also advantageous because the abrasion resistance and adhesive properties can be improved. Further, an anti-Ni-diffusion layer may be formed between the conductive layer and the Ni—Mo alloy layer as the underlayer. The structure of the anti-Ni-diffusion layer is the same as the anti-Ni-diffusion layer provided between the conductive layer and the capping layer as describe before.

When the layer containing Mo or a Mo alloy as the major component is formed as an underlayer under the conductive layer, Mo exposes in the cross-sectioned portion of a patterned portion after the patterning. However, an improvement of the humidity resistance can be kept because the major portion of the layer containing Mo or a Mo alloy as the major component is covered with the substrate or the ITO film, and the conductive layer.

In the formation of a laminate without the anti-Ni-diffusion layer, when an oxidizing process, a nitriding process or a carbonizing process (or a combination of these processes) is conducted, a laminate having desired characteristics can be formed. In this case, there is an advantage of obtaining the laminate with a smaller number of layers.

Or, when a laminate made of metal comprising 4 layers or 5 layers is formed, there is an advantage that a continuous production is possible by using an in-line type continuous film forming system.

Further, the laminate of the present invention may have a silica layer between the conductive layer and the substrate. The silica layer may be in contact with the substrate or may be without contact thereto. Generally, the silica layer is formed by sputtering a silica target. When a glass substrate is used as the substrate, the deterioration of the conductive layer is prevented because an alkali component in the glass substrate moves to the conductive layer. It is preferable that the film thickness is 5 to 30 nm.

The laminate of the present invention is of a low resistance; is excellent in feasibility of patterning and has a high humidity resistance. When such laminate is used for an organic EL display element, the organic EL display element having a long lifetime and an improved luminescent characteristics is obtainable because it is provided with wires of highly reliable and low resistance. The thus obtained laminate of the present invention is preferably subjected to etching by a photolithographic method in order to form a substrate with wires.

A photoresist is coated on the capping layer providing the outermost surface of the laminate; a pattern for wires is formed by baking, and an unnecessary portion of the metal layer is removed according to the pattern of the photo-resist by an etching liquid, whereby the substrate with wires is formed. The etching liquid is preferably an aqueous solution of acid such as phosphoric acid, nitric acid, acetic acid, sulfuric acid or hydrochloric acid, or a mixture of these components, ammonium cerium nitrate, perchloric acid or a mixture of these components.

A mixed solution of water and phosphoric acid, nitric acid, acetic acid or sulfuric acid is preferable. A mixed solution of water and phosphoric acid, nitric acid or acetic acid is more preferable.

In the formation of the substrate with wires, each layer of the laminate, for example, each layer of (1) capping layer/conductive layer/substrate, (2) capping layer/conductive layer/underlayer/ITO layer/substrate or (3) capping layer/anti-Ni-diffusion layer/conductive layer/anti-Ni-diffusion layer/underlayer/ITO layer/substrate is subjected to etching to have the same pattern.

When the laminate has the ITO layer, the capping layer/conductive layer may be removed together with the ITO layer by an etching liquid. Or, the capping layer and the conductive layer may be previously removed and the ITO layer is separately removed. Or, the ITO layer may be previously patterned; the conductive layer and the capping layer are sputtered, and then, portions of the capping layer/conductive layer excluding a wire portion are removed.

Figure 2:
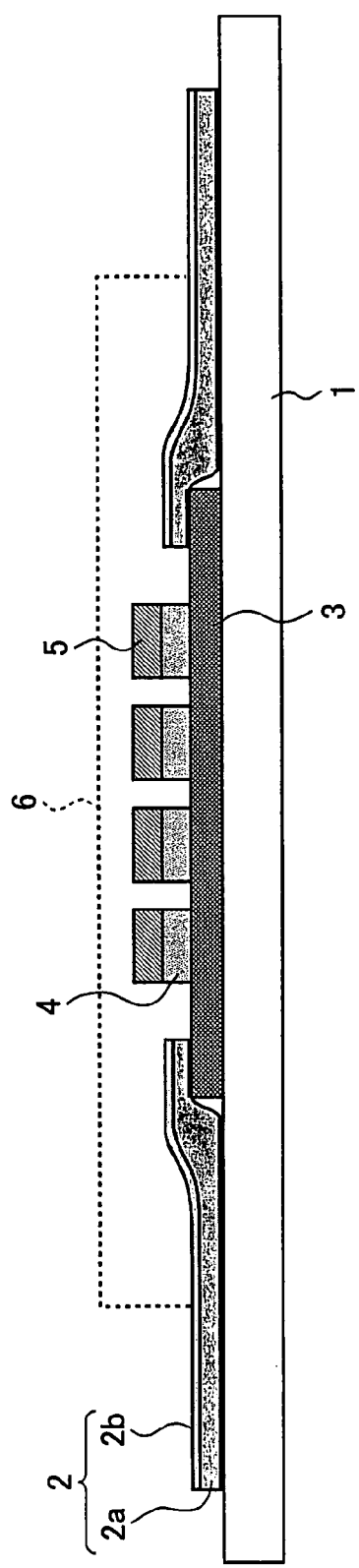
FIG. 2 is a cross-sectional view of the part taken along an A–A' cutting-plane line in FIG. 1.
Figure 3:
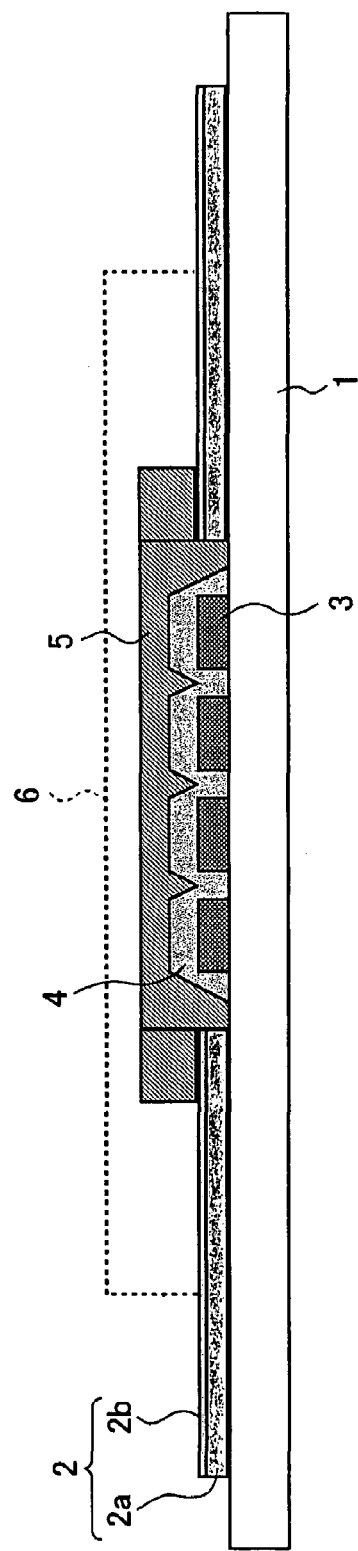
FIG. 3 is a cross-sectional view of the part taken along a B–B' cutting-plane line in FIG. 1.

In the next, a preferred example of producing a substrate with wires and the laminate and an organic EL display element by using the substrate according to the present invention will be described with reference to FIGS. 1 to 3. However, the present invention is not limited to such examples.

First, an ITO film is formed on a glass substrate 1. Etching is conducted to the ITO film to form an ITO anode 3 of stripe pattern. Then, a Ni—Mo alloy layer (not shown) is formed by sputtering so as to cover the entire surface of the glass substrate. On the alloy layer, a Mo series metal layer (not shown) as the underlayer, an Al series metal layer 2a as the conductive layer, a Mo series metal layer (not shown) as the anti-Ni-diffusion layer and a Ni—Mo layer 2b as the capping layer are formed in this order by sputtering to thereby obtain a laminate for forming a substrate with wires. Of course, the ITO layer may be formed entirely or partly on the glass substrate 1.

A photoresist is coated on the laminate. Unnecessary portions of the metal layers are removed by etching according to the pattern of the photoresist. When the photoresist is peeled off, wires 2 comprised of the Ni—Mo alloy layer, the Mo series metal layer, the Al series metal layer 2a, the Mo series metal layer and the Ni—Mo alloy layer 2b is obtained. Then, a ultraviolet ray-ozone treatment or an oxygen-plasma treatment is conducted to the entirety of the laminate by irradiation and cleaning with ultraviolet rays. In the irradiation and cleaning with ultraviolet rays, ultraviolet rays are generally irradiated with a U.V. lamp to remove organic matters.

Then, an organic layer 4 having a hole transport layer, a light emission layer and an electron transport layer is formed on the ITO anode 3. When a cathode separator (separator) is to be formed, the separator is formed by photolithography before the organic layer 4 is formed by vacuum deposition.

An Al cathode 5 as a cathode back-electrode is formed by sputtering so as to cross perpendicularly to the ITO electrode 3 after the wires 2, the ITO electrode 3 and the organic layer 4 are formed.

Then, the portion surrounded by a broken line is sealed with resin to form a sealed can 6.

Since the substrate with wires of the present invention comprises the above-mentioned laminate wherein Al or an Al alloy of low resistance is used for the conductive layer and a Ni—Mo alloy having a high humidity resistance is used for the capping layer, it has a low resistance and is excellent in patterning, and has a high humidity resistance whereby there is little possibility of causing the deterioration of the wires.

Further, when the laminate of the present invention is used for a substrate with wires for an organic EL display element, it is necessary to conduct, to the substrate, a ultraviolet ray-ozone treatment that is a special treatment for organic electroluminescence. In this case, the substrate with wires of the present invention has durability against such treatment.

By using the laminate of the present invention, the substrate with wires having a low resistance, being excellent in patterning, and having a high humidity resistance can be formed. Further, a display of high precision and highly reliable can be provided. In particular, an organic EL display element having a long lifetime and being desired for lowering the resistance of the wires in order to improve luminescence characteristics, can be used effectively.

In the following, the present invention will be described by several Examples. However, the present invention should not be limited to these.

COMPARATIVE EXAMPLES 1–5

Soda lime glass substrates having a thickness of 0.7 mm, a length of 100 mm and a width of 100 mm were cleaned. The glass substrates were set on a sputtering device. A RF magnetron sputtering was carried out by using a silica target to form a silica layer having a thickness of 20 nm on each substrate. Thus, glass substrates with silica layers were obtained.

Then, a d.c. magnetron sputtering was carried out by using an ITO target (containing 10 mass % of $SnO_2$ based on the total amount of $In_2O_3$ and $SnO_2$) to form an ITO layer having a thickness of 160 nm, whereby glass substrates with an ITO layer (referred simply to as the substrates) were obtained. As sputtering gas, Ar gas containing 0.5 volume % of $O_2$ gas was used.

A d.c. magnetron sputtering was carried out in an Ar gas atmosphere by using 5 kinds of targets to the entire surface (excluding the portion used for holding the substrates) of the glass substrates with ITO layers to thereby form 5 kinds of single films as shown in Table 1. Thus, glass substrates with films were obtained. The backpressure was $1.3 \times 10^{-3}$ Pa, the sputtering pressure was 0.3 Pa and the substrates were not heated. The magnetron sputtering to an Ni target was possible since the thickness of the target was reduced to 1 mm.

The film thickness, the sheet resistance, the etching rate and the humidity resistance (1) of the glass substrates with films were measured. Results are shown in Table 1.

The sheet resistance was measured by a four-probe method with use of Loresta IP MCP-T250 manufactured by Mitsubishi Petrochemical Co., Ltd.

The etching rate was obtained by measuring a time expended until the film on each substrate was dissolved under the condition that the substrates with films were dipped for 5 minutes in an etching liquid comprising phosphoric acid, nitric acid, acetic acid and water in proportion of 16:1:2:1 in volume ratio. The case of incompletion of the etching even after 5 minutes was evaluated as X.

Evaluation of the humidity resistance (1) was made by measuring a change of the resistance after the glass substrates with films were left one day under conditions of 60° C. and 95% RH by using a constant temperature and constant humidity chamber (PR-1S manufactured by Espec Co., Ltd). The case that the change rate of the sheet resistance was less than 5% was evaluated as ○, and the case that the change rate of the sheet resistance was at least 5% was evaluated as X.

It is understood from Table 1 that the Mo layer has a low humidity resistance, and the Ni layer and the Ni—Mo alloy layer have an excellent humidity resistance. In the case of the Mo layer, corrosion could be observed visually in its surface. In cases of Ni layer and the Ni—Mo alloy layer, on the other hand, corrosion could not be observed visually in their surfaces.

The etching to the Ni layer was not finished even after 5-minutes dipping. On the other hand, the Ni—Mo alloy layer could be etched at the same etching rate as the Al layer or faster than it. Namely, excellent etching performance was exhibited. In particular, when a Ni—Mo—Fe alloy target was used, substantially the same etching rate as the Al layer could be obtained. Accordingly, in Examples described below, a Ni—Mo—Fe alloy target having a mass percentage of 65%-32%-3% (hereinbelow, it may be referred to as the Ni—Mo target) was used in order to form a Mo alloy layer. The layer formed by the Ni—Mo target is referred to as the Ni—Mo alloy layer.

EXAMPLES 1–2

Soda lime glass substrates having a thickness of 0.7 mm, a length of 100 mm and a width of 100 mm were cleaned. The glass substrates were set on a sputtering apparatus. A RF magnetron sputtering was carried out by using a silica target to form a silica layer having a thickness of 20 nm on each substrate. Thus, glass substrates with silica layers were obtained.

A d.c. magnetron sputtering was carried out in an Ar atmosphere by using an Al metal target to the entire surface (excluding the portion used for holding the substrates) of the glass substrates with silica layers to thereby form Al layers (conductive layers). The backpressure was $1.3 \times 10^{-3}$ Pa, the sputtering pressure was 0.3 Pa and the substrates were not heated.

A d.c. magnetron sputtering was carried out in an Ar gas atmosphere by using a Mo target (Example 1) or a Ni—Mo target (Example 2) to glass substrates with conductive layers thus obtained whereby a Mo layer (Example 1) or a Ni—Mo alloy layer (Example 2) was formed as a capping layer. Thus, laminates for substrates with wires were obtained. The backpressure was $1.3 \times 10^{-3}$ Pa, the sputtering pressure was 0.3 Pa and the substrates were not heated.

The film thickness, the humidity resistance (1), of the laminates for substrates with wires, the sheet resistance before heating and the heat resistance of the laminates were measured. Results are shown in Table 2.

Evaluation of the humidity resistance (1) was made in the same manner as Reference Example 1. When the capping layer was the Mo layer (Example 1), corrosion could be observed visually in its surface. However, when the capping layer was the Ni—Mo alloy layer (Example 2), corrosion could not be observed visually in its surface.

The heat treatment to the laminates was carried out by leaving the laminates in a constant temperature chamber (PMS-P101 manufactured by Espec Co., Ltd.) at 320° C. in the atmosphere for 1 hour, and the sheet resistance of the laminates before the heat treatment and the change rate of the resistance before and after the heat treatment were measured. The case that the change rate of the sheet resistance was not more than 10% was evaluated as ○; the case that it exceeded 10% but not more than 100% was as Δ, and the case that it exceeded 100% was as X.

EXAMPLE 3

A d.c. magnetron sputtering was carried out in an Ar gas atmosphere by using a Ni—Mo target to the entire surface (excluding the portion used for holding the substrate) of glass substrate with an ITO layer in Reference Example 1 to thereby form a Ni—Mo alloy layer (an undercoat layer). Thus, a glass substrate with an undercoat layer was obtained.

The backpressure was $1.3 \times 10^{-3}$ Pa, the sputtering pressure was 0.3 Pa and the substrate was not heated. Then, an Al layer (a conductive layer) and a Ni—Mo alloy layer (a capping layer) were formed on the undercoat layer under the same conditions as Example 2 to thereby obtain a laminate for forming a substrate with wires. The film thickness and the humidity resistance (1) of the laminate, the sheet resistance before a heat treatment and the heat resistance of the laminate were measured in the same manner as Example 1. Table 2 shows a result.

Figure 4:
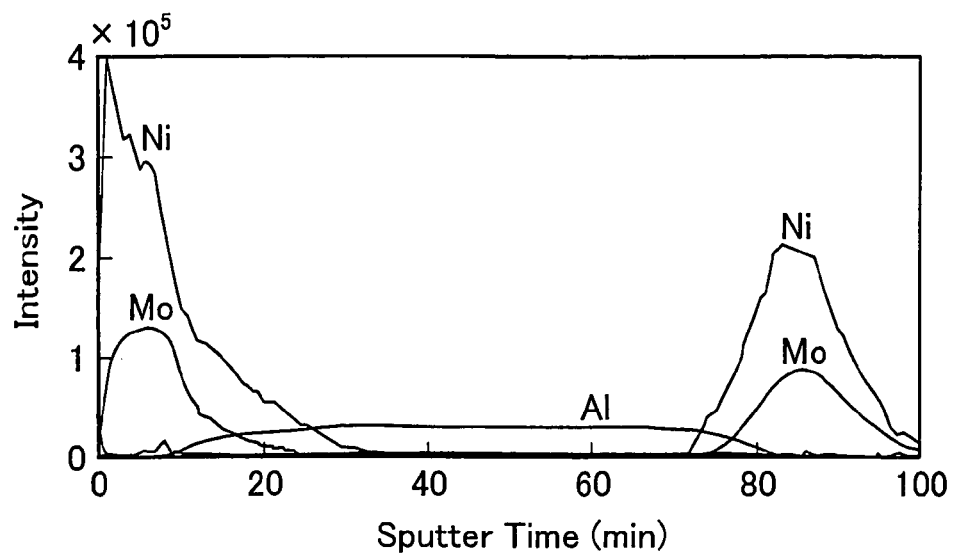
FIG. 4(a) is a diagram showing an ESCA depth profile before a heat treatment of a laminate for the substrate with wires in Example 3.
FIG. 4(b) is a diagram showing an ESCA depth profile after the heat treatment of the laminate for the substrate with wires in Example 3.
Figure 4:
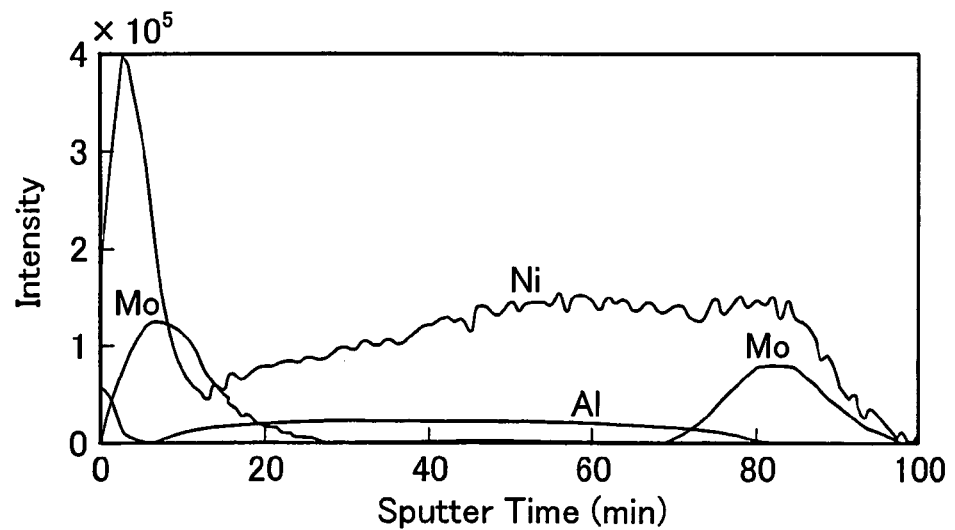

FIGS. 4(a) and 4(b) show an ESCA depth profiles of the laminate of Example 3 before and after the heat treatment. It is understood that Ni metal diffuses into the Al layer (the conductive layer) by the heat treatment in the laminate of Example 3.

EXAMPLES 4–7

A d.c. magnetron sputtering was carried out in an Ar gas atmosphere by using a Mo target to form a Mo layer (an anti-Ni-diffusion layer) on the undercoat layer of each of the glass substrates with undercoat layers in Example 3. Then, an Al layer (a conductive layer) was formed on the anti-Ni-diffusion layer in the same manner as Example 2, and a Mo layer (an anti-Ni-diffusion layer) was formed on the conductive layer under the same conditions as the above-mentioned anti-Ni-diffusion layer.

Further, a Ni—Mo alloy layer (a capping layer) was formed on each of the anti-Ni-diffusion layers by using a Ni—Mo target under the same conditions as Example 2 to obtain laminates for a substrate with wires.

The film thickness and the humidity resistance (1) of the laminates, the sheet resistance before a heat treatment and the heat resistance of the laminates were measured in the same manner as Example 1, Table 2 shows results.

It is clear from Table 2 and FIGS. 4(a) and 4(b) that the capping layer comprising the Mo layer in Example 1 shows bad humidity resistance, but the Ni—Mo alloy layer in Example 2 shows excellent humidity resistance. Further, it is understood that when a heat treatment is carried out in a state that the Ni—Mo alloy layer is in contact with the Al layer as in Example 3, the heat resistance becomes worse.

On the other hand, it is cleat from results of Examples 4–7 that the Mo layer interposed between the NiMo alloy layer and the Al layer prevents the deterioration of the heat resistance. Further, it is understood that a good result can be obtained when the film thickness of the Mo layer is preferably 10 nm or more and 60 nm or less.

EXAMPLES 8–11

Sputtering was carried out under the same conditions as in Example 3 except that a mixed gas having the composition shown in Table 3 was used instead of the Ar gas used in Example 3, as sputtering gas for forming the undercoat layer and the capping layer, to thereby obtain laminates for substrates with wires.

The film thickness and the humidity resistance (1) of the laminates, the sheet resistance before a heat treatment and the heat resistance of the laminates were measured in the same manner as Example 1, Table 3 shows results.

It is understood from Table 3 that when nitriding or oxidizing/carbonizing are conducted to the Ni—Mo alloy layer, the diffusion of Ni into the Al series metal layer is prevented and the deterioration of the heat resistance can be prevented.

EXAMPLE 12

A mask pattern having a line/space of 25 μm/65 μm was used for the laminate for forming a substrate with wires of Example 5. Patterning was carried out by using an Al etching liquid by a photolithographic method to prepare a substrate with wires.

The film thickness of the laminate, the sheet resistance of the laminate before the patterning and the change rate of the resistance (heat resistance) of the laminate before and after the heat treatment were measured in the same manner as Example 1. Table 4 shows a result.

In the evaluation of the feasibility of the patterning, the distance of etching proceeded beyond the patterning line was measured from a direction perpendicular to the line and an amount of over-etching was observed. The case that an amount of over-etching was 2 μm or less was evaluated as ○ and the case that it was more than 2 μm was evaluated as X.

Figure 5A:
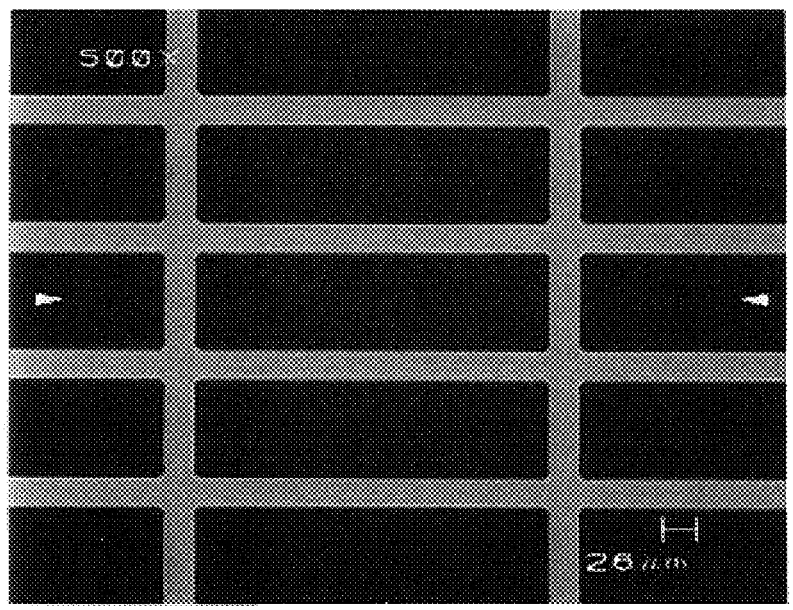
FIG. 5(a) is a photograph showing an observation result with a laser microscope after the humidity resistance test of the substrate with wires of the present invention in Example 12.

The humidity resistance (2) of the substrate with wires after the patterning was evaluated under conditions that the substrate with wires was left one day at 60° C. and 95% RH by using a constant temperature/constant humidity chamber (PR-1S manufactured by Espec Co., Ltd), and wires were observed with a laser microscope. The case that no corrosion was recognized in the wires was evaluated as ○, and the case that corrosion was recognized was evaluated as X. Table 4 shows a result of the feasibility of patterning and the humidity resistance (2). Further, FIG. 5(a) shows a result of observation of the substrate with wires of Example 12 with a laser microscope (magnification: 500 times) after the evaluation of the humidity resistance (2).

EXAMPLE 13

A d.c. magnetron sputtering was carried out in a mixed Ar—$CO_2$ gas atmosphere having the composition as shown in Table 4 by using a Ni—Mo target to the entire surface (excluding the portion used for holding the substrate) of the glass substrate with an ITO layer in Reference Example 1 to thereby form a Ni—Mo alloy layer (an undercoat layer). The backpressure was $1.3 \times 10^{-3}$ Pa, the sputtering pressure was 0.3 Pa and the substrate was not heated.

Then, an Al layer (a conductive layer) was formed on the undercoat layer by using an Al metal target, and a Mo alloy layer (an anti-Ni-diffusion layer) was formed on the Al layer (conductive layer) by using a Mo target. Further, a Ni—Mo alloy layer (capping layer) was formed on the anti-Ni-diffusion layer by using a Ni—Mo target to thereby obtain a laminate for forming a substrate with wires.

The film thickness of the laminate, the sheet resistance of the laminate before the patterning and the change rate of the resistance (heat resistance) of the laminate before and after a heat treatment were measured in the same manner as Example 1. Table 4 shows a result.

Then, patterning was carried out under the same conditions as the method in Example 12 to obtain a substrate with wires. The feasibility of patterning and the humidity resistance (2) of the substrate with wires were measured in the same manner as Example 12. Table 4 shows a result of evaluation. Further, the humidity resistance (3) of the substrate with wires after the pattering of the laminate was evaluated under the same conditions as the case of the humidity resistance (2) except that the substrate was left for 5 days. Table 5 shows a result.

EXAMPLE 14

A d.c. magnetron sputtering was carried out in a mixed Ar—$CO_2$ gas atmosphere having the composition shown in Table 4 by using a Ni—Mo target to the entire surface (excluding the portion used for holding the substrate) of the glass substrate with an ITO layer in Reference Example 1 to thereby form a Ni—Mo alloy layer (an undercoat layer). The backpressure was $1.3\times10^{-3}$ Pa, the sputtering pressure was 0.3 Pa and the substrate was not heated.

Then, an Al layer (a conductive layer) was formed on the undercoat layer by using an Al metal target.

Further, a Ni—Mo alloy layer (a capping layer) was formed on the conductive layer by using a d.c. magnetron sputtering method using a Ni—Mo target in a mixed Ar—$CO_2$ gas atmosphere having the composition as shown in Table 4 to thereby obtain a laminate for forming a substrate with wires. The film thickness of the laminate, the sheet resistance of the laminate before the patterning and the change rate of the resistance (heat resistance) of the laminate before and after a heat treatment were measured in the same manner as Example 1, Table 4 shows a result.

Then, patterning was carried out under the same conditions as the method in Example 12 to obtain a substrate with wires. The feasibility of patterning and the humidity resistance (2) of the substrate with wires were measured in the same manner as Example 2. Table 4 shows a result of evaluation.

EXAMPLE 15

A d.c. magnetron sputtering was carried out in an Ar gas atmosphere by using a Mo target to the entire surface (excluding the portion used for holding the substrate) of the glass substrate with an ITO layer in Reference Example 1 to thereby form a Mo layer. The backpressure was $1.3\times10^{-3}$ Pa, the sputtering pressure was 0.3 Pa and the substrate was not heated.

Then, an Al layer (a conductive layer) was formed on the undercoat layer by using an Al metal target, and a Mo layer (a capping layer) was formed on the conductive layer by using a Mo target to obtain a laminate for forming a substrate with wires. The film thickness of the laminate, the sheet resistance of the laminate before the patterning and the change rate of the resistance (heat resistance) of the laminate before and after a heat treatment were measured in the same manner as Example 1, Table 4 shows a result.

Then, patterning was carried out under the same conditions as the method in Example 12 to obtain a substrate with wires. The feasibility of patterning and the humidity resistance (2) of the substrate with wires were measured in the same manner as Example 12. Table 4 shows a result of evaluation. Further, FIG. 5(b) shows a result of observation of the substrate with wires of Example 15 with a laser microscope (magnification: 500 times) after the evaluation of the humidity resistance (2).

Figure 5B:
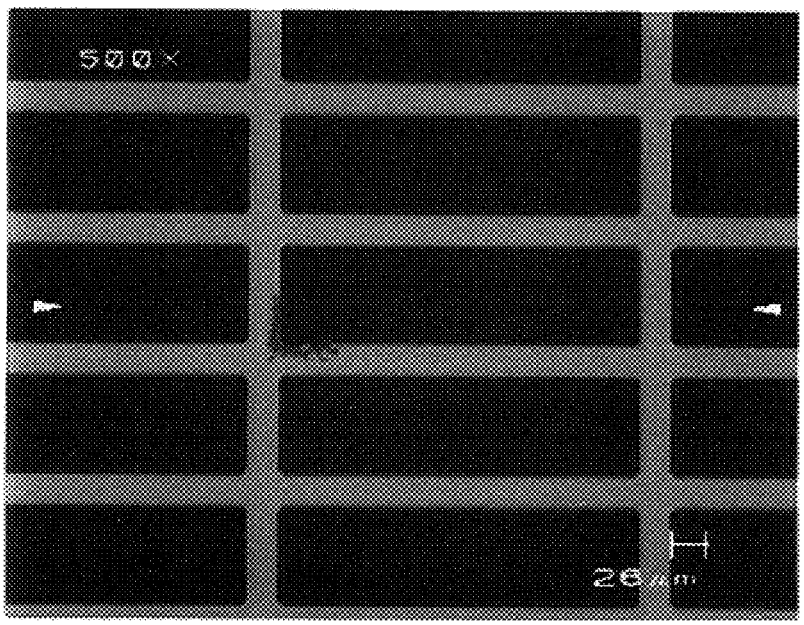
FIG. 5(b) is a photograph showing an observation result with the laser microscope after the humidity resistance test of the substrate with wires in Example 15.

In view of Table 4 and FIG. 5(b), it is understood that the capping layer comprising a Mo layer has a low humidity resistance.

EXAMPLE 16

Sputtering was carried out under the same conditions as in Example 13 except that the anti-Ni-diffusion layer in Example 13 was not formed, to form a laminate according to the present invention. The film thickness of the laminate, the sheet resistance of the laminate before the patterning and the change rate of the resistance (heat resistance) of the laminate before and after a heat treatment were measured in the same manner as Example 1, Table 4 shows a result.

Then, patterning was carried out under the same conditions as the method in Example 13 to obtain a substrate with wires. The feasibility of patterning, the humidity resistance (2) and the humidity resistance (3) of the substrate with wires were measured in the same manner as Example 13. Table 5 shows a result. The humidity resistance (2) is obtained through a test of one day and the humidity resistance (3) is obtained through a test of consecutive 5 days. In the Table, ○ means no corrosion, Δ means slight corrosion and X means corrosion.

EXAMPLE 17

The anti-Ni-diffusion layer in Example 13 was formed by using a Mo—Nb alloy target in which the content of Nb was 5 mass %. Sputtering was carried out under the same conditions as Example 13 except that the anti-Ni-diffusion layer was a Mo—Nb alloy layer to thereby form a laminate. The film thickness of the laminate, the sheet resistance of the laminate before the patterning and the change rate of the resistance (heat resistance) of the laminate before and after a heat treatment were measured in the same manner as Example 1. Table 4 shows a result.

Then, patterning was carried out under the same conditions as the method in Example 13 to obtain a substrate with wires. The feasibility of patterning, the humidity resistance (2) and the humidity resistance (3) of the substrate with wires were measured in the same manner as Example 13. Table 5 shows a result of evaluation.

EXAMPLE 18

The anti-Ni-diffusion layer in Example 13 was formed by using a Mo—Nb alloy target in which the content of Nb was 10 mass %. Sputtering was carried out under the same conditions as Example 13 except that the anti-Ni-diffusion layer was a Mo—Nb alloy layer to thereby form a laminate. The film thickness of the laminate, the sheet resistance of the laminate before the patterning and the change rate of the resistance (heat resistance) of the laminate before and after a heat treatment were measured in the same manner as Example 1, Table 4 shows a result.

Then, patterning was carried out under the same conditions as the method in Example 13 to obtain a substrate with wires. The feasibility of patterning, the humidity resistance (2) and the humidity resistance (3) of the substrate with wires were measured in the same manner as Example 13. Table 5 shows a result.

From Table 5, it is understood that the anti-Ni-diffusion layer comprising a MoNb alloy further improves the humidity resistance.

EXAMPLE 19

Sputtering was carried out under the same conditions as Example 13 except that the temperature of the substrate in Example 13 was 200° C., to obtain a laminate. The film thickness of the laminate, the sheet resistance of the laminate before the patterning, the feasibility of patterning, the humidity resistance (2) and the humidity resistance (3) of the laminate were measured in the same manner as Example 13. Table 5 shows a result.

The surface roughness (Ra) was measured with an atomic force microscope (Nano Scope IIIa manufactured by Digital Instrument Inc.). Ra in Example 13 was 3 nm and Ra in Example 19 was 21 nm. From these results, it is understood that when the substrate is heated, the resistance decreases. On the other hand, it is understood that when the substrate is heated, the surface roughness increases.

In the above-mentioned Examples, when a process of oxidizing, nitriding or carbonizing or processes of oxidizing and nitriding, nitriding and carbonizing, or oxidizing, nitriding and carbonizing are conducted, an amount of these atoms contained in the thus formed metal film is considered to be, for instance, from several % to about 30%.

Figure 21:
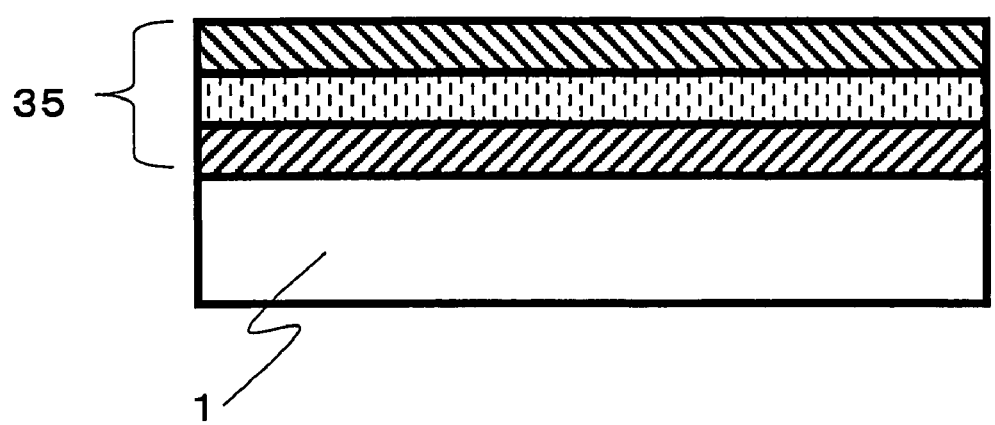
FIG. 21 is a cross-sectional view showing a structural example 1 of the laminate of the present invention.
Figure 22:
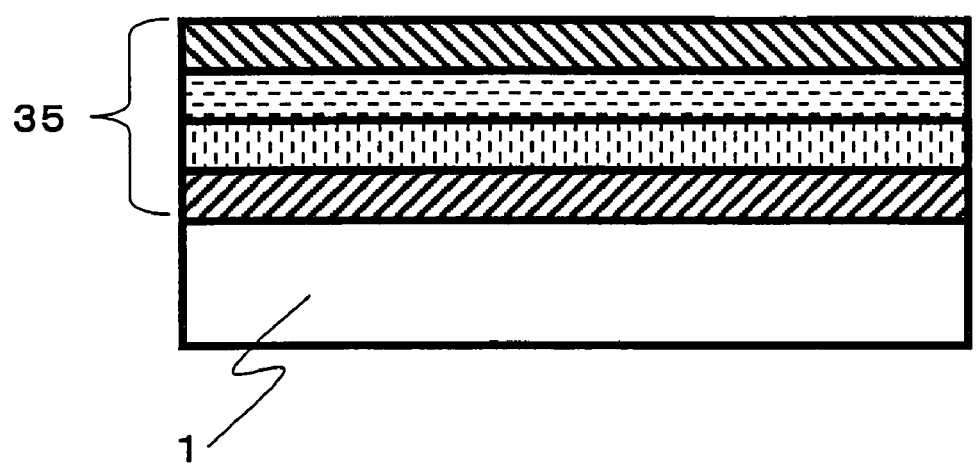
FIG. 22 is a cross-sectional view showing a structural example 2 of the laminate of the present invention.

FIGS. 21 and 22 are cross-sectional views of a part of the laminate of the present invention. FIG. 21 shows a laminate having a three-layer structure of laminate films 35, e.g., a layered structure of NiMo—$O_x$/Al series metal/NiMo—$N_y$. FIG. 22 shows a four-layer structure of laminate films 35, e.g., NiMo—$O_x$/Al series metal/Mo/NiMo or NiMo—$O_x$/Al series metal/MoNb/NiMo. Further, the laminate includes a five-layer structure of laminate films, e.g., NiMo—$O_x$/Mo/Al series metal/Mo/NiMo.

Figure 23:
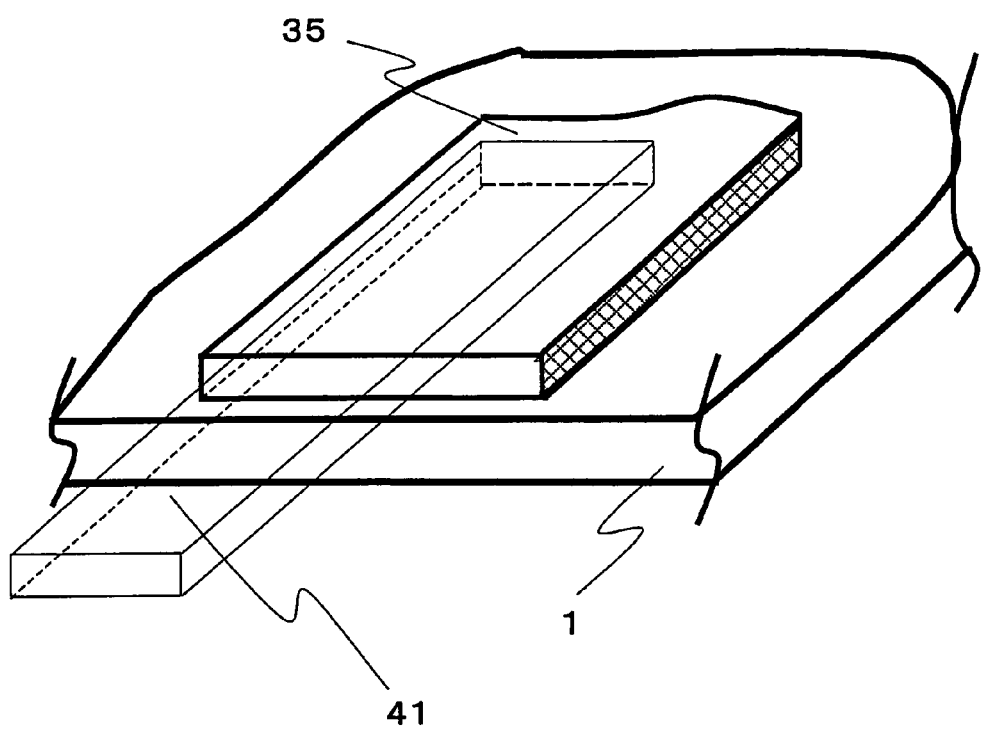
FIG. 23 is a perspective view of an Embodiment of the substrate with wires of the present invention.
Figure 24:
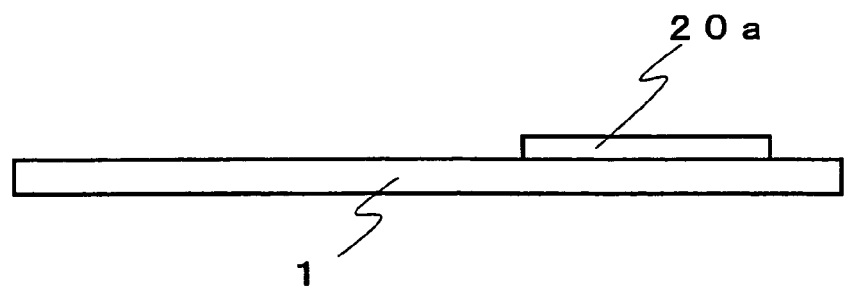
FIG. 24 is a cross-sectional view partly omitted showing a forming step 1 for a cathode side circuitous circuit of an organic EL display element.
Figure 25:
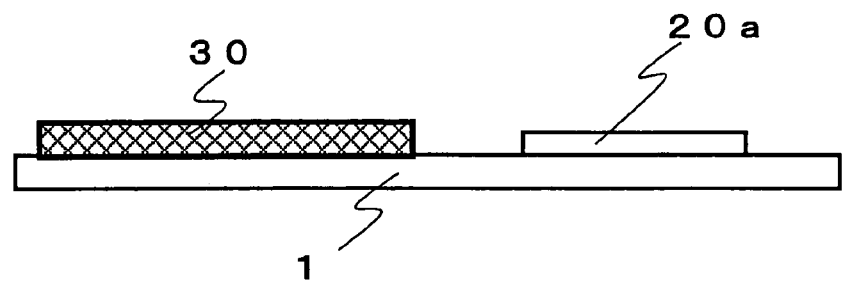
FIG. 25 is a cross-sectional view partly omitted showing a forming step 2 for the cathode side circuitous circuit of the organic EL display element.
Figure 26:
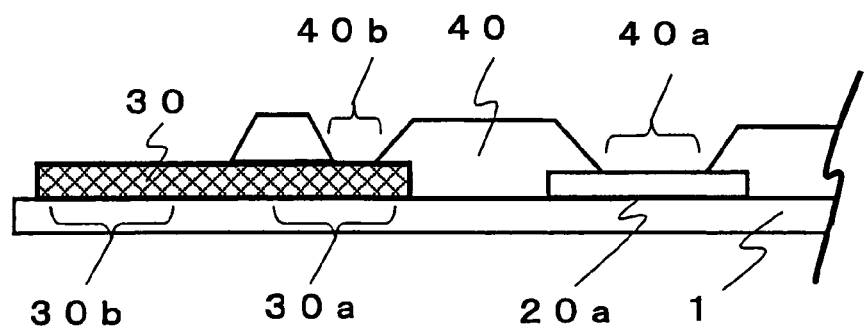
FIG. 26 is a cross-sectional view partly omitted showing a forming step 3 for the cathode side circuitous circuit of the organic EL display element.
Figure 27:
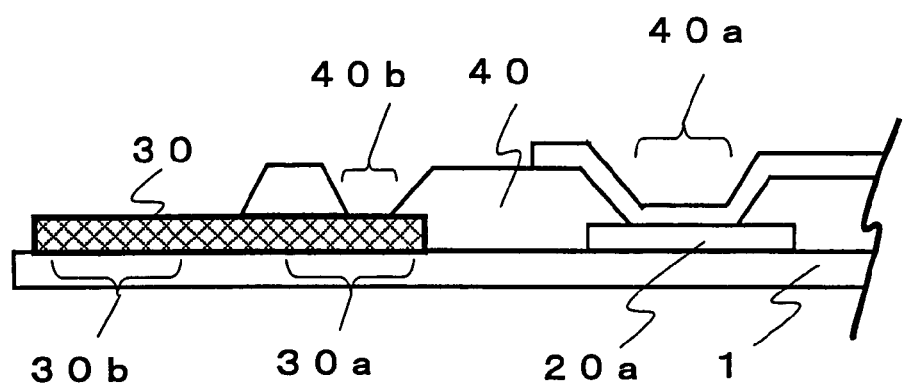
FIG. 27 is a cross-sectional view partly omitted showing a forming step 4 for the cathode side circuitous circuit of the organic EL display element.
Figure 28:
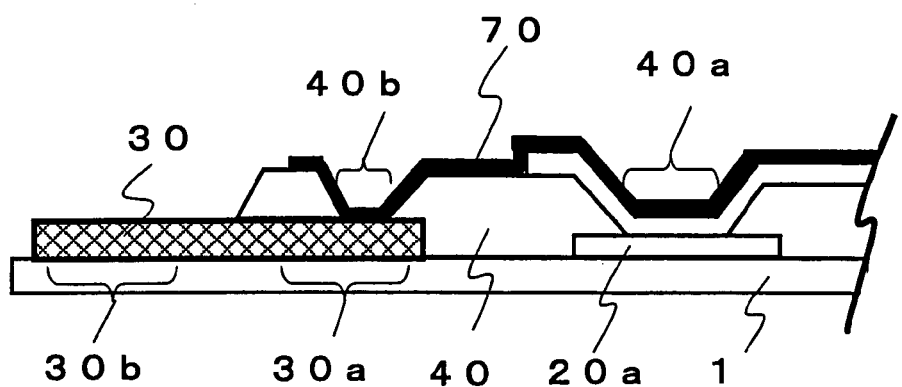
FIG. 28 is a cross-sectional view partly omitted showing a forming step 5 for the cathode side circuitous circuit of the organic EL display element.

FIG. 23 is a diagram showing a portion around a connection terminal of the organic EL display element. An external connection lead 41 is connected to a connection terminal according to the present invention.

In the following, explanation will be made about Examples B1 to B4 for forming organic EL display elements. Examples B1 to B4 relate to passive matrix driving type organic EL display elements. However, these techniques can, of course, be applied to TFT driving type organic EL display elements using electrodes of low resistance.

EXAMPLE B1

Figure 20:
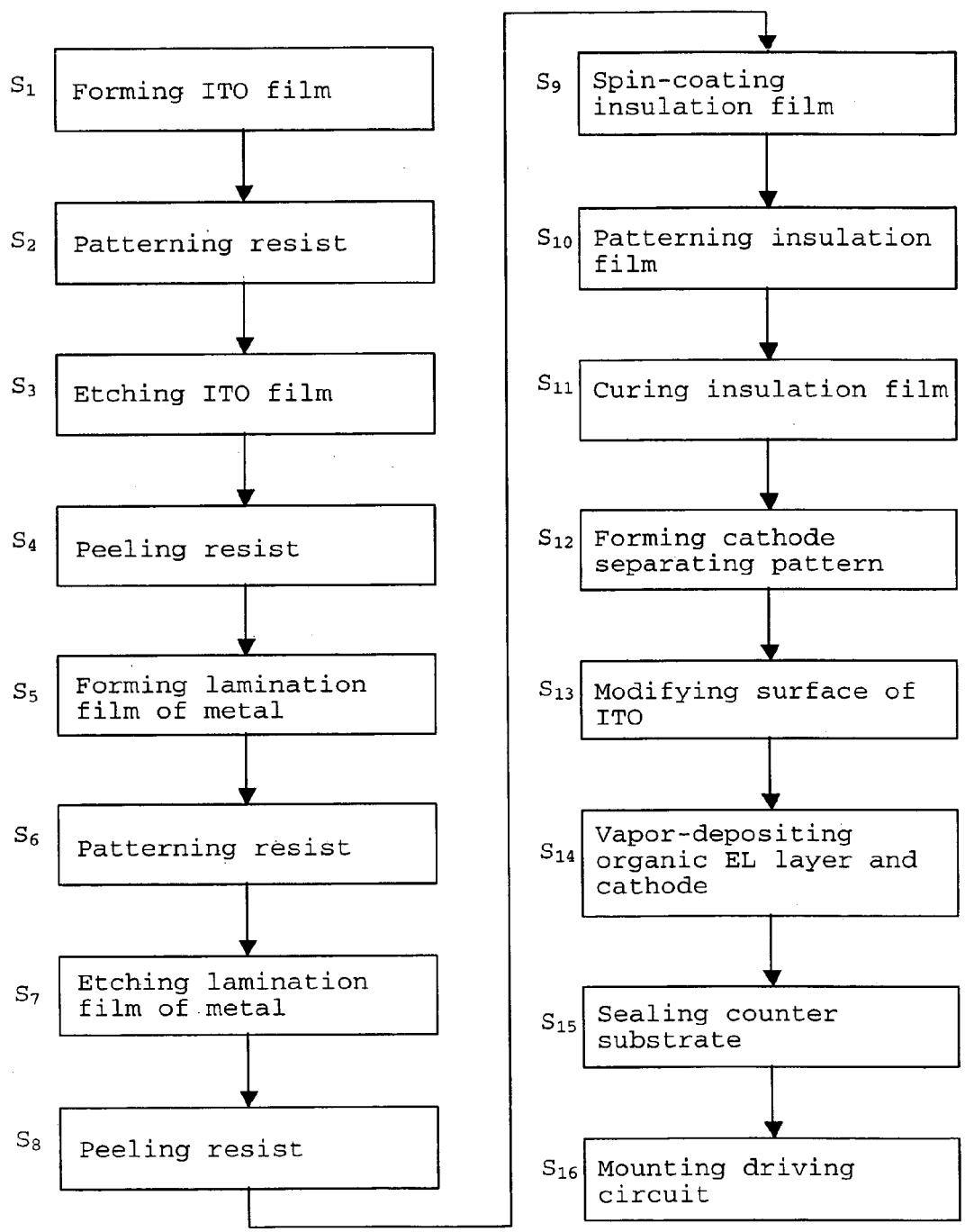
FIG. 20 is a flow chart showing a method for production according to the present invention.

FIG. 6 is a plan view showing an example of the organic EL display element of the present invention. FIG. 7 is a cross-sectional view taken along C–C' in FIG. 6. In FIG. 6, a counter substrate and TCP are omitted from the Figure. FIG. 20 is a flowchart of a method for forming the organic EL display element of the present invention. In the following, description will be made as to steps of FIG. 20 sequentially with reference to FIGS. 6 and 7.

Figure 29:
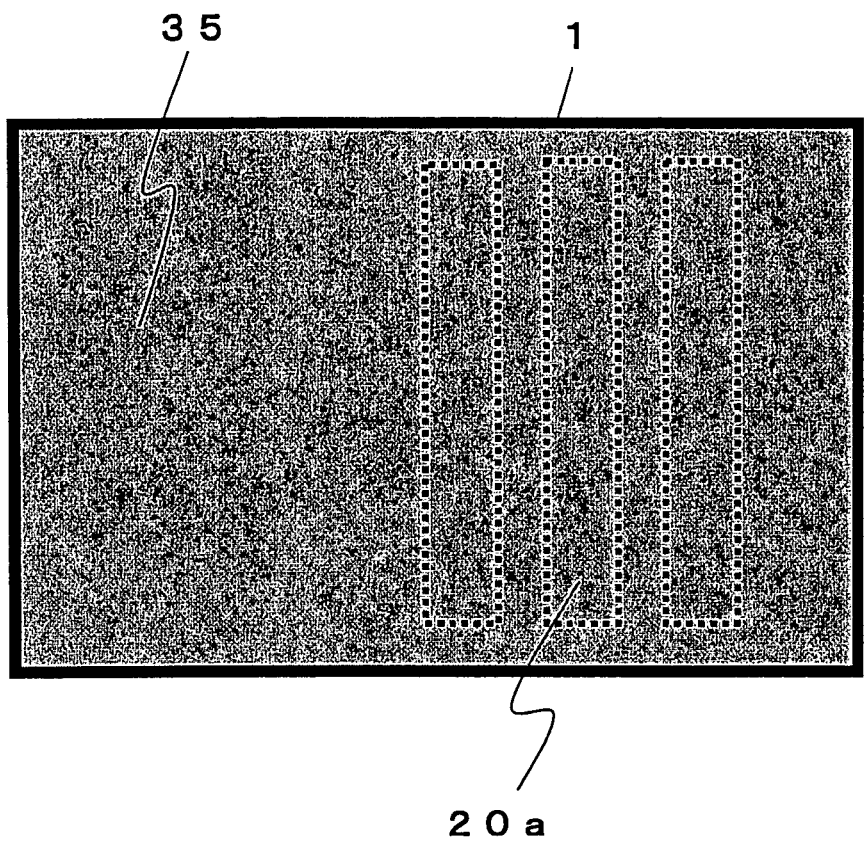
FIG. 29 is a diagrammatical plan view in a manufacturing step 1 of the organic EL display element of the present invention.
Figure 30:
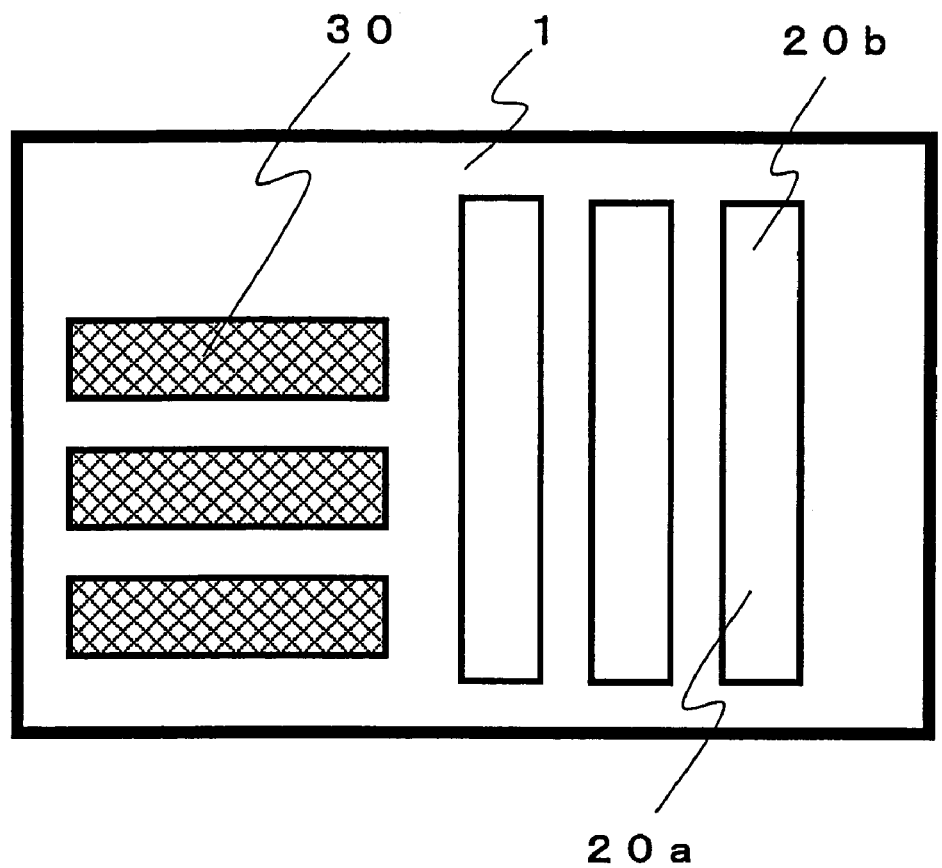
FIG. 30 is a diagrammatical plan view in a manufacturing step 2 of the organic EL display element of the present invention.

Further, each state of the organic EL display element corresponding each step is shown in partly cross-sectional views of FIGS. 24 to 28, and plan views are shown in FIGS. 29 to 33. A transparent conductive film (ITO layer) is formed on a substrate followed by patterning the film to thereby form an electrode layer usable as an anode 20a. A connection terminal 20b for the anode is located at an end portion of the substrate. Then, a lamination film 35 of metal is formed on the substantially entire surface of the substrate (FIG. 29). Thereafter, the lamination film 35 is patterned to form supplementary wires 30 (FIG. 30).

Figure 31:
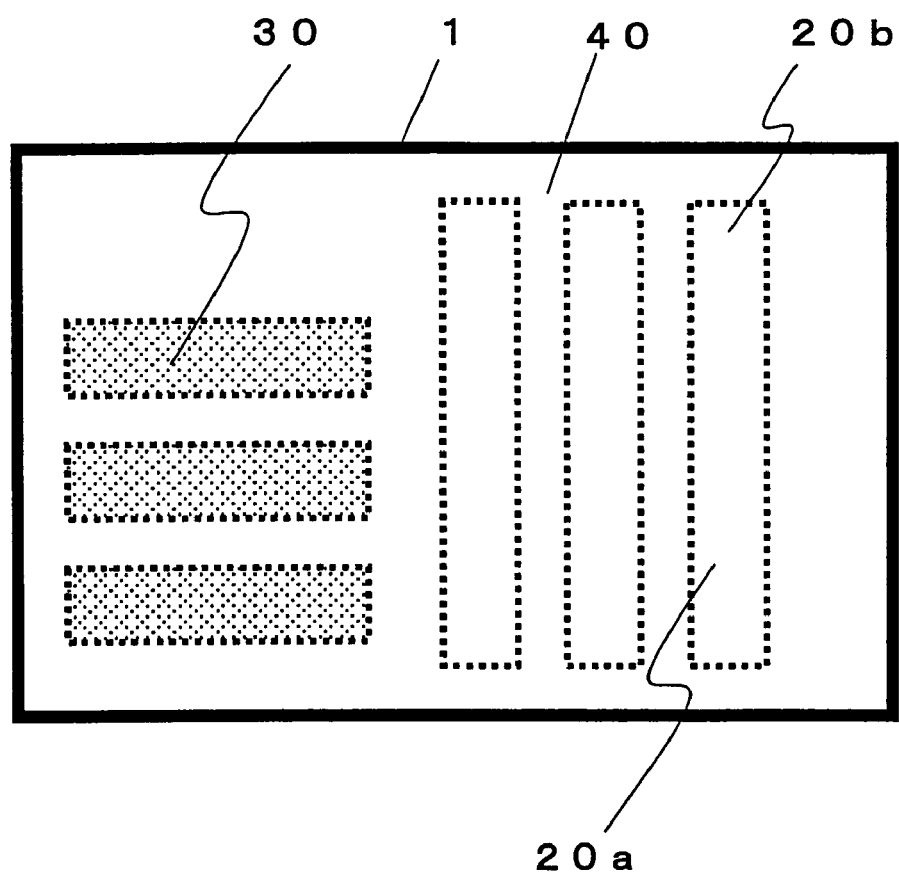
FIG. 31 is a diagrammatical plan view in a manufacturing step 3 of the organic EL display element of the present invention.
Figure 32:
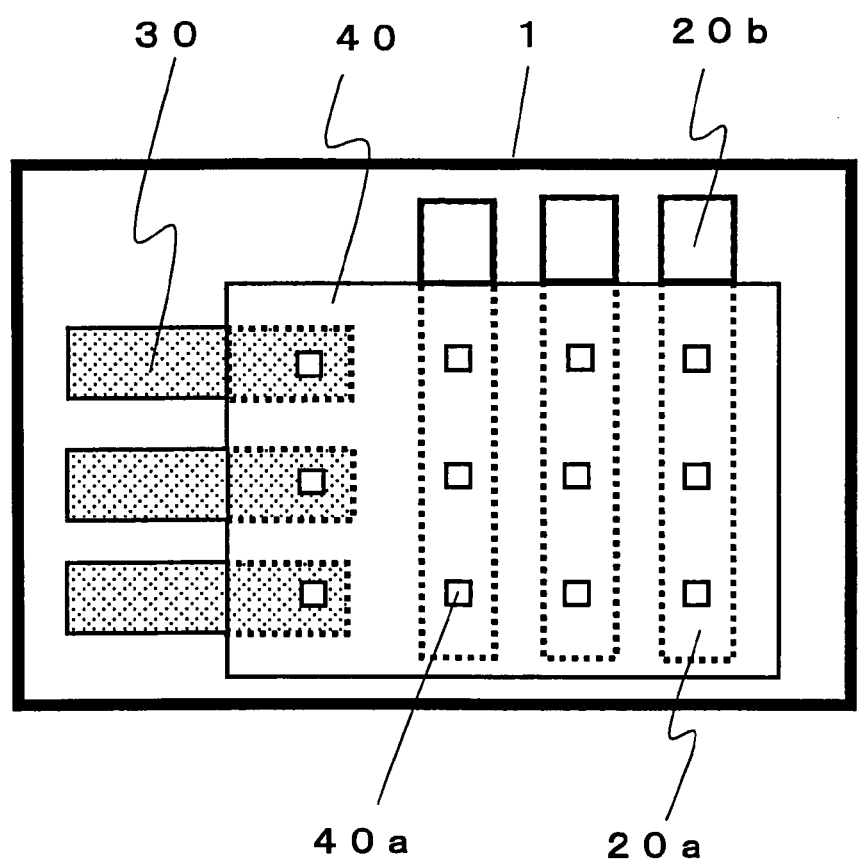
FIG. 32 is a diagrammatical plan view in a manufacturing step 4 of the organic EL display element of the present invention.
Figure 33:
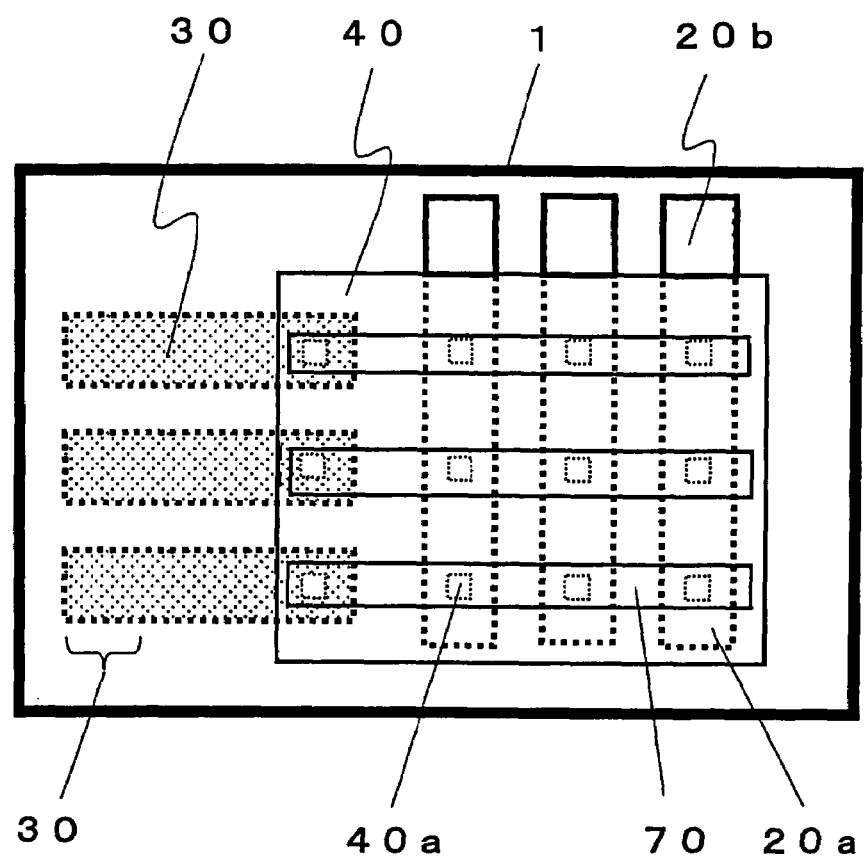
FIG. 33 is a diagrammatical plan view in a manufacturing step 5 of the organic EL display element of the present invention.

Then, an insulation film 40 is formed so that display portions of anodes 20a are covered with the insulation film 40 so as to cover the entirety of the substrate surface including the supplementary wires 30 and the anodes 20a to form apertures 40a for pixels (FIG. 31). Then, a pattern of insulation film having the pixel apertures 40a and insulation film apertures 40b is formed (FIG. 32). Further, a pattern of metal is formed for cathodes 70 so as to obtain electric contact to the supplementary wires 30 at these portions (FIG. 33). End portions of the supplementary wires are patterned to form connection terminals and are connected to an external driving circuit.

In the laminate of the present invention, patterning of the anodes may be carried out first and then, forming the metal lamination film on the substrate (see FIG. 29). Or, a desired film may optionally be formed depending on the size of the substrate surface.

First, a conductive layer is formed on a silica coat layer of a glass substrate 1 having the silica coat layer at Step $S_1$. This conductive layer corresponds to the second electrode layer as described before. As the glass substrate, soda lime glass may be used, for example. The thickness of the silica coat layer is generally 5 to 30 nm, and the silica coat layer can be formed by, e.g., a sputtering method.

The conductive layer generally has translucency. The meaning of translucency should include the case having a certain degree of translucency other than the case that the transmittance of light is high as 90 to 100% like a so-called a transparent conductive layer. The second electrode layer is preferably a transparent conductive layer because it performs sufficiently function as a display element.

The thickness of the conductive layer is generally 50 to 300 nm, more preferably, 100 to 200 nm. Typically, an ITO film prepared by a d.c. sputtering method is used. In this example, an ITO film is used. The conductive layer can generally be formed by a physical vapor phase epitaxial method (PVD) such as a vacuum deposition method, ion plating method or the like.

Then, at Step $S_2$, a resist was patterned by a photolithographic process. At Step $S_3$, the ITO film was etched. Then, at Step $S_4$, the resist is peeled off to obtain the anodes 20a and connection terminals 20b for the anodes. Any known resist may be used unless it is against the spirit of the present invention. For the etching, a mixed aqueous solution of hydrochloric acid and nitric acid can be used. In order to peel off the resist, any known parting agent may be used unless it is against the spirit of the present invention.

Then, at Step $S_5$, a lamination film of metal including a capping layer comprising a low resistance layer of Al or an Al alloy and a Ni alloy is formed by d.c. sputtering. It is preferable to use Al form the low resistance layer in order to reduce the resistance of wires. In this case, it is possible to use an Al alloy such as AlNd or AlSiCu to improve the anti-corrosion characteristics. A detailed example of film formation will be described later.

Then, at Step $S_6$, the resist is patterned by a photolithographic method. At Step $S_7$, the lamination film of metal is etched. At Step $S_8$, the resist is peeled off. For the resist used for forming the lamination film, any known resist may be used unless it is against the spirit of the present invention.

In the etching, an etching liquid composed of a mixed aqueous solution of phosphoric acid, acetic acid and nitric acid can be used, for example. In order to peel off the resist, any known parting agent may be used unless it is against the spirit of the present invention. Laminated films in the present invention can be etched altogether by this etching liquid. Thus, the supplementary wires 30 can be formed. Further, an internal patterned portion 30a located at an inner side of the element and the connection-terminal side patterned portion 30b are formed.

For the patterning process for the ITO film (Steps $S_2$ to $S_4$) and the patterning process for the lamination film of metal (Step $S_6$ to $S_8$), it is possible to form sequentially the ITO film and the lamination film of metal by sputtering and then, patterning is conducted to the lamination film of metal and the ITO film in this order. However, it is preferable to use a manufacturing method in which patterning to ITO is conducted beforehand because of the reason as follows. In ITO etching after the patterning of the supplementary wires, the etching liquid used for ITO is of a strong acid. If there is pin holes in the resist, there is a possibility of losing the pattern for supplementary wires.

Then, at Step $S_9$, spin coating of, e.g., a photosensitive polyimide film as the insulation film is carried out. At Step $S_{10}$, patterning is carried out by a photolithographic method. At Step $S_{11}$, the film is cured to thereby obtain a pattern of insulation film 40 having apertures 40a for pixels at pixel portions as shown in FIGS. 6 and 7. The film thickness of the pattern of insulation film 40 after curing is generally about 1.0 μm. When an aperture for a pixel is about 300 μm×300 μm, the contact portion between a cathode and a supplementary wire should be 200 μm×200 μm or less because there is no substantial effect to the size of the display element.

Figure 9:
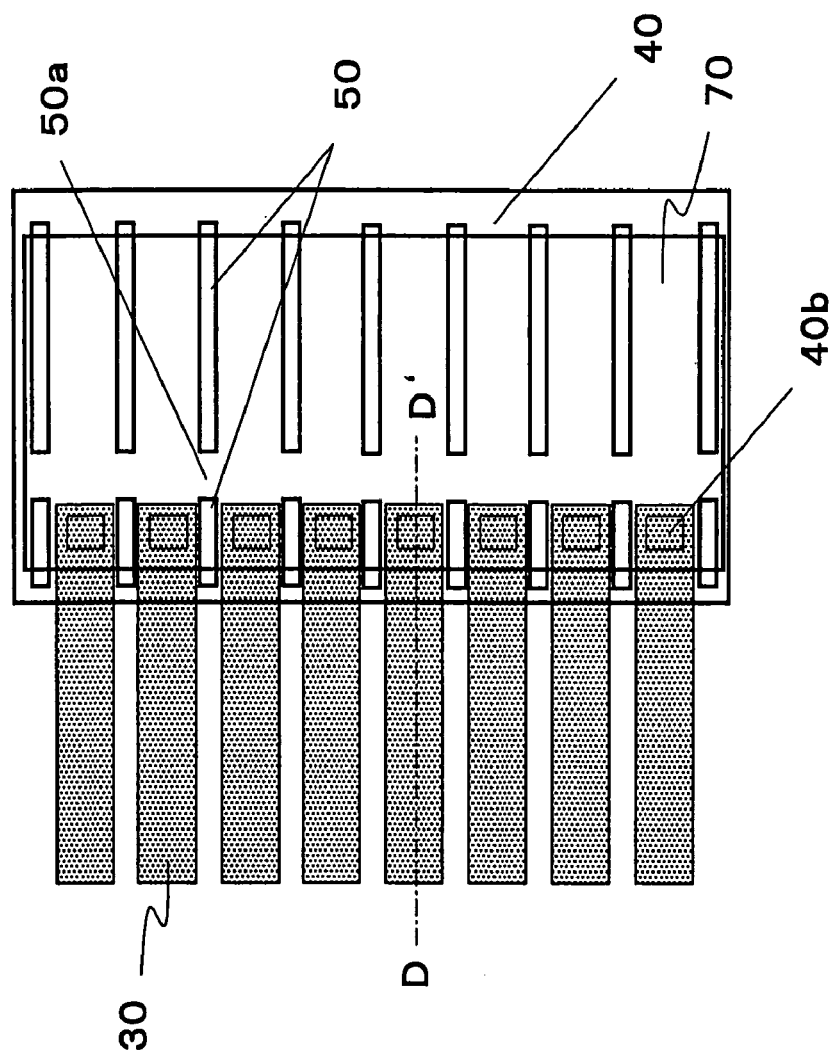
FIG. 9 is a plan view of TEG for evaluating a contact resistances of a cathode and a supplementary wire.

Then, at Step $S_{12}$, spin coating of, e.g., a photosensitive acrylic resin is carried out; patterning of the formed resin is carried out by a photolithographic method followed by curing whereby a pattern 50 for separating cathodes is formed (see FIG. 9). When the pattern for separating cathodes is formed, a negative type photosensitive resin is preferably used so as to provide a reverse taper structure. Use of the negative type photosensitive resin causes insufficient curing at a deeper position when light is irradiated from an upper side of the resin. As a result, the cross-sectional area of a lower portion of the cured portion is narrower than that of an upper portion of the cured portion in view of the above. Such structure is referred to as the reverse taper structure.

In using such reverse taper structure, when a mask for forming the cathodes is to be formed by vacuum deposition in a later process, vacuum deposition does not reach a hidden portion in view of the above. Accordingly, it is possible to separate cathodes individually. There is a case that the above-mentioned photosensitive polyimide resin and photosensitive acrylic resin are interchangeable. Further, any known resin for the insulation film such as epoxy resin, phenol resin or the like can be used unless it is against the spirit of the present invention.

Then, at Step $S_{13}$, irradiation of oxygen plasma is carried out by using, e.g., a parallel plate type RF plasma (high frequency plasma) device to modify the surface of the ITO film. Then, at Step $S_{14}$, an organic EL layer 60 and the cathodes 70 are formed by vacuum deposition through the mask by using, e.g., a vacuum deposition device (see FIGS. 27 to 28 and FIGS. 29 to 33).

These cathodes correspond to the first electrode layer of the present invention. The organic EL layer often comprises an interface layer, a hole transport layer, a light emitting layer, an electron injection layer and so on as structural elements. However, the organic EL layer may have a different layer structure. The thickness of the organic EL layer is generally 100 to 300 nm.

By forming the insulation film pattern, end portions of the anodes 20a are covered with the insulation film. Accordingly, the surface of the organic EL layer in contact with the anodes 20a is made flat whereby a possibility of breaking of the organic EL layer or a cathode due to concentration of the electric field or the like can be reduced, and the withstand voltage of an anode and a cathode can be improved. Al is often used for the cathodes. However, alkali metal such as Li or the like or an alloy of Ag, Ca, Mg, Y, In or including these can be used instead of Al.

The thickness of a cathode is generally 50 to 300 nm. It is not necessary that a cathode consists of solely Al or an Al alloy, but the portion of the conductive layer to be connected to a supplementary wire may contain Al or an Al alloy. There is a case that cathode is formed by a physical vapor phase epitaxial method such as sputtering, ion plating or the like, other than the above-mentioned method.

Thus, patterned organic EL portions 60 formed of the organic EL layer and the patterned cathode portions 70 are formed (see a plan view of FIG. 6). By applying the lamination film of the present invention to the supplementary wires and the terminal portions of the cathodes, they are of a low resistance and it is possible to maintain low contact resistance characteristics to the cathodes and the connection terminal of a driving circuit. Further, an organic EL display element with supplementary wires having reliable contact characteristics and a driving circuit for driving the organic EL display element can be obtained.

At $S_{15}$, a resin film in which CaO is mixed as a hydroscopic agent 100 is bonded to a counter substrate 80. For the bonding, it is desirable for the counter substrate 80 that the glass substrate is caved partially by sand blasting or the like. Then, a ultraviolet curing type resin is dispensed at a peripheral portion of the substrate of the element and the counter substrate 8 is bonded thereto. Ultraviolet rays are irradiated thereto to form a peripheral seal 90 to thereby fix the counter substrate 80. Such processes are carried out in a nitrogen atmosphere so that moisture and oxygen do not enter into the display panel. Then, the substrate is cut to form each panel, and terminal portions are exposed.

At $S_{16}$, an external driving circuit is mounted. Specifically, an anisotropic conductive film 110 is bonded to the connection-terminal side patterned portion 30b which provides connection terminals, and then, wires of copper sheet for TCP are arranged so as to overlap the terminals with TCP side connection wires followed by bonding by heat pressing.

Here, explanation will be made as to a sealing process and a consecutive mounting process, which are important in the organic EL display element, with reference to FIG. 17. Since the organic EL display element is deteriorated by moisture, the counter substrate 80 is sealed with the peripheral seal 90. As a sealing material used for this purpose, a photosensitive epoxy resin is preferred.

Next, explanation will be made as to the hydroscopic agent for the organic EL display element. In the organic EL display element, it is preferable to incorporate the hydroscopic agent in order to remove moisture during operations of sealing. As the hydroscopic agent, there are barium oxide, calcium oxide, zeolite and so on. For example, a hydroscopic film 100 which calcium oxide is mixed in a resin film bonded to a concave portion at an inner surface side of the counter substrate 80 (see FIG. 17).

Then, the anodes and the cathodes are connected to an external driving circuit. Then, the driving circuit formed in a TCP structure is mounted on terminal portions of the anodes and the cathodes. Further, as the method for connecting the organic EL display element to the driving circuit, terminals connected electrically to wires in the element are provided and the terminals are connected to the driving circuit.

In order to perform a high density connection, there are a method that the external driving circuit is connected to a side of a polyimide film having patterned thin copper wires and the other side is connected to element terminals via an anisotropic conductive film (ACF) (a TCP mounting) or a method that a metal bump is provided at bare tips of the driving circuit and is connected to terminals via ACF (COG mounting).

TCP is a structure that a driving IC and a connection wire are provided on a film such as polyimide. The terminal portion in the TCP mounting is shown in a plan view of FIG.

18 and a cross-sectional view taken along a E-E' cutting-plane line in FIG. 18 is shown in FIG. 19. Terminals 30C are formed on the glass substrate 1, an anisotropic conductive film (ACF) 110 is bonded thereon, and connection wires 150 formed on a polyimide film of TCP 120 are bonded thereon so as to obtain alignment to the terminals. The anisotropic conductive film is constituted by dispersing conductive particles 130 in a resin. As the resin, an epoxy resin is generally used, and as the conductive particles, Ni or Au-coated plastic particles or Ni particles are used.

The TCP is formed by forming driving ICs 140 and connection wires 150 on a polyimide tape 160. The connection wires 150 are made mainly of Cu. The TCP connecting process is as follows. First, ACF is bonded temporarily to the terminal portion. The temperature for temporarily bonding is generally about 50 to 150° C. and the pressure is generally 1 to 2 MPa. Then, after adjusting the positional relation between the connection wires 150 of TCP and the terminals 30C, the TCP is bonded permanently. The temperature for permanently bonding is generally about 150 to 250° C. and the pressure is generally 2 to 3 MPa. After the permanently bonding, the conductive particles between the connection wires 150 and the terminals 30C are crushed to obtain electric connection. After the mounting is completed, the mounted portion may be covered with a resin to prevent corrosion. Generally, a silicone type resin or an ultraviolet curing type epoxy resin is used.

Thus, the organic EL display element is prepared. Further, a test element group (hereinbelow, referred to as TEG) is sometimes formed in order to confirm function of individual parts and to obtain the performance of each process. TEG produced in the same manner as the above-mentioned process is shown in FIGS. 8 and 9.

Figure 10:
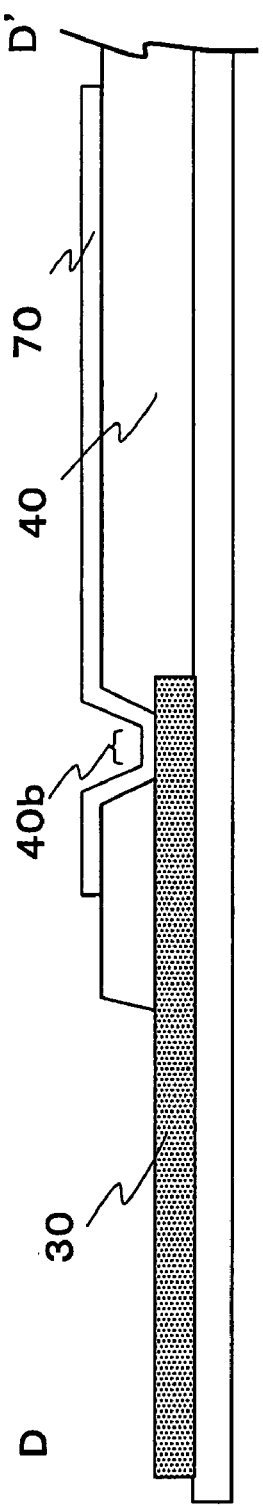
FIG. 10 is a cross-sectional view partly omitted taken along a D–D' cutting-plane line in FIG. 9.

Although TEG is formed with constructional materials of a part, it is formed via all processes until $S_{15}$ in FIG. 20. These processes allow evaluation of not only performance and workability of the materials but also influence to the materials, suffered from the process history. A pattern of supplementary wire 30 as shown in FIG. 8 is formed by processes of forming the ITO film, removing it by etching and forming a lamination film of metal. By using this pattern, the resistance of a wire constituted by the lamination film can be obtained. Here, the width of the wire is 40 μm and the length of the wire is 6.8 mm. The structure in FIG. 9 is formed according to processes of $S_1$ to $S_{14}$. The shape in cross-section taken along a D-D' cutting-plane line in FIG. 9 is shown in FIG. 10.

First, the ITO film is removed at $S_1$ to $S_4$. Then, patterning is conducted to the lamination film to form the supplementary wires 30 at $S_5$ to $S_8$, and the pattern of insulation film 40 and patterned apertures 40b of insulation film are formed at $S_9$ to $S_{11}$. A patterned aperture of insulation film has a square shape having a side of 200 μm. Then, the cathode separating pattern 50 is formed at $S_{12}$. This pattern is provided with slits 50a near apertures of insulation film.

Then, the pattern for the cathodes 70 is formed at $S_{14}$ to complete TEG. In this TEG, the supplementary wires 30 formed by patterning the lamination film of metal are connected to the patterned cathodes 70 at apertures 40b of insulation film. When a voltage is applied across adjacent supplementary wires (patterned lamination film) 30, a current flows from the patterned aperture 40b to the patterned cathode and further flows to the adjacent supplementary wires (patterned lamination film) 30 via the slits 50a of patterned partitions.

At this moment, the current flows in the connection between two patterned metal portions (parts of lamination film) and the patterned cathode. Accordingly, it is possible to calculate the resistance of the connecting portion (contact resistance) by subtracting resistances of the other portions. The reason that the cathode separating pattern is provided, is as follows. A developing solution may stay at a patterned aperture 40b of insulation film at the time of developing the cathode separating pattern, and there is a possibility of causing adverse influence to the contact resistance. For this, faithful reproduction is necessary. Thus, it is possible to evaluate resistances of wires and the contact resistance between a supplementary wire and a cathode.

According to the above-mentioned explanation, an organic EL display element was prepared. The contents of each process are the same as above unless specifically described.

EXAMPLE B2

According to the above-mentioned explanation, TEG for the wire resistance and TEG for the contact resistance shown in FIGS. 8, 9 and 10 are prepared.

First, according to $S_1$ to $S_4$, an ITO film having 150 nm was formed and it was removed partially. Then, films of NiMo, Mo, Al, Mo and NiMo were formed sequentially by d.c. sputtering. When the underlayer of NiMo was formed, $CO_2$ was fed for oxidizing and carbonizing.

The NiMo layer is 50 nm, Mo is 200 nm, and the Al layer is 400 nm in thickness. These laminated films can be etched all together with an aqueous solution of phosphoric acid, acetic acid and nitric acid. By these treatments, a pattern of laminated metal 3 was obtained. Then, a pattern of insulation film 40 was obtained. In FIG. 8, the pattern of insulation film is not formed at this moment. Then, a cathode separating pattern 50 was obtained. In the same manner as above, the cathode separating pattern is not formed in FIG. 8. Slits 50a of the cathode separating pattern are of 300 μm.

Then, irradiation of oxygen plasma was carried out to modify the surface of the ITO film by using a parallel plate type RF plasma device. Specifically, a plasma processing of RIE (reactive ion etching) mode was conducted for 60 sec under plasma processing conditions of a flow rate of oxygen of 50 sccm (50 mL/min in a standard condition), a total gas pressure of 6.7 Pa and 1.5 kW.

Then, by using a vapor deposition device, vapor deposition of Al was carried out for cathode through a mask in 300 nm to obtain a patterned cathode 70. Thus prepared TEG for the wire resistance was measured by a four-terminal method to find 25.5 Ω. In conversion of the obtained resistance into the sheet resistance, it was 0.15 Ω/□. The heat resistance of the film just after sputtering was 0.13 Ω/□.

Figure 11:
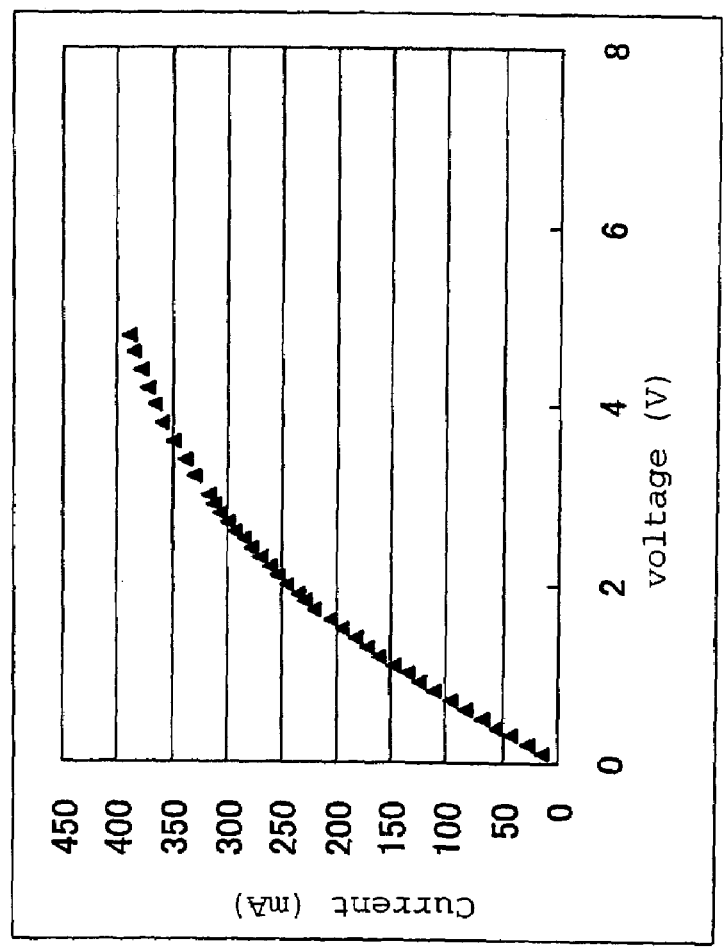
FIG. 11 is a current vs voltage characteristics diagram of a contact TEG obtained in Example B2.
Figure 12:
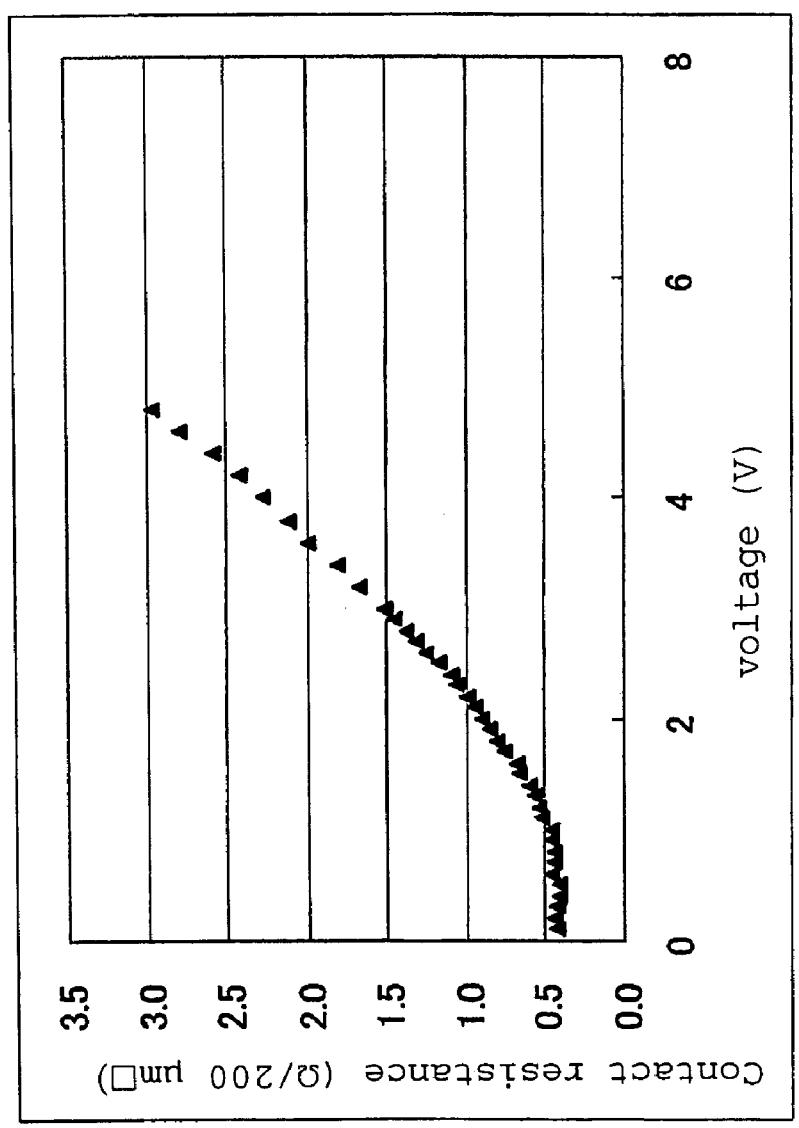
FIG. 12 shows a contact resistance of the contact TEG obtained in Example B2.
Figure 13:
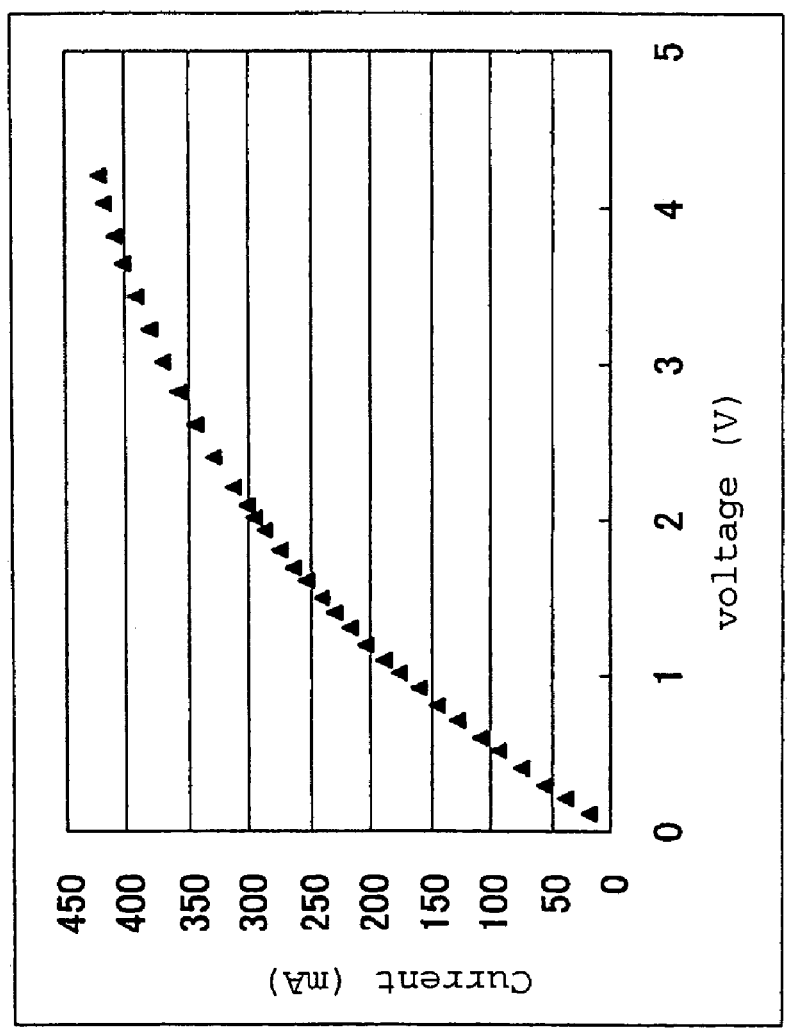
FIG. 13 is a current vs voltage characteristics diagram of the contact TEG obtained in Example B3.
Figure 14:
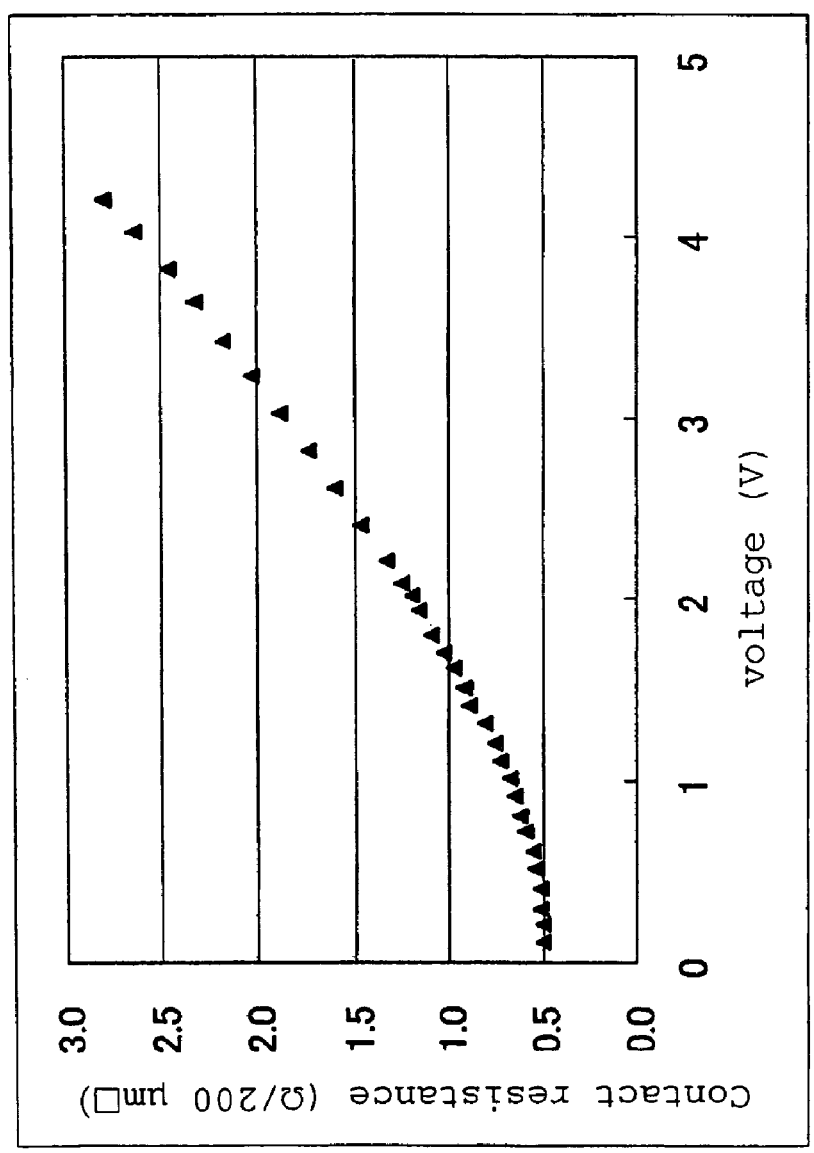
FIG. 14 shows a contact resistance of the contact TEG obtained in Example B3.

This revealed that wires having low resistance were formed although there was found a certain increase of the resistance in processes for forming the organic EL display element. FIG. 11 shows current vs voltage characteristics with respect to the TEG for the contact resistance, and FIG. 12 shows the contact resistance. The contact resistance is obtained by subtracting the voltage in the wire portion at the normal temperature from the obtained resistance.

A voltage was applied to adjacent patterned metal portions of TEG with a probe. As a result, the terminal was burned off at the contact position between the probe and the terminal at 4.8 V, and it was impossible to apply a higher voltage. As is understood from the result of measurement that when the above-mentioned five-layered lamination film is applied to supplementary wires, the contact resistance is low as about 0.5 to 3.0 Ω, and a current of 350 mA or higher would be able to feed thereto. The fact that the increase of the current is gradually suppressed, is considered that the temperature of the wire portion is increased by the current and the resistance is increased.

In the evaluation of a similar pattern made of Cr, the contact resistance could be controlled to be about 10 Ω. However, when a current of about 10 mA was fed, the pattern was burned off at the contact portion.

Thus, by applying the above-mentioned lamination film of metal to supplementary wires for the organic EL display element, they showed a low resistance and a low contact resistance in comparison with the conventional wires made of Cr. Accordingly, a display allowing a large current flow and a display of high luminance and high duty could be fabricated.

EXAMPLE B3

TEG was prepared by using another lamination film of metal in the same manner as Example B1. The lamination film of metal used was obtained by forming NiMo, Al and NiMo sequentially. In the formation of the underlayer of NiMo, $CO_2$ was supplied for oxidizing and carbonizing. When the capping layer of NiMo was to be formed, $N_2$ was supplied for nitriding. The NiMo layer is 50 nm and the Al layer is 400 nm in thickness. The other processes are the same as in Example B1.

In the measurement of thus prepared TEG for the wire resistance by a four-terminal method, the resistance was 18.7 Ω. In conversion of the measured resistance to the sheet resistance, 0.11 Ω/□ is obtainable. FIG. 11 shows current-voltage characteristics with respect to the TEG for contact resistance, and FIG. 12 shows the contact resistance. In this Example, the wire was burnt off at its positive side in the application of 4.2 V, and it was impossible to apply a higher voltage. By applying the lamination film to supplementary wires for the organic EL display element, a display having performance comparable with or higher than the case of Example B1 could be prepared.

EXAMPLE B4

According to the before-mentioned explanation, an organic EL display element and TEG were prepared. The method for preparing TEG is omitted. FIG. 6 is a plan view of the organic EL display element in this example, and FIG. 7 is a cross-sectional view taken along C–C' in FIG. 6.

First, an ITO film of 150 nm was formed on a silica coat layer of a soda lime glass substrate 1 of 0.7 mm thick, having the silica coat layer of 20 nm formed by sputtering, by d.c. sputtering. Then, patterning of resist was carried out by a photolithographic process. Thereafter, the ITO film was etched, by using a mixed aqueous solution of hydrochloric acid and nitric acid, followed by peeling off the resist, whereby a pattern of anodes 20a and connection terminals 20b for the anodes was obtained.

As the resist, a phenol novolack resin was used, and as the resist parting agent, monoethanolamine was used. Then, lamination films of metal of NiMo, Al, Mo and NiMo were formed in this order. In film thicknesses of lamination films of metal, the NiMo layer is 50 nm, the Mo layer is 20 nm and Al is 360 nm. The NiMo layer as an underlayer was oxidized and carbonized by feeding $CO_2$.

Then, patterning of the resist was carried out by a photolithographic method. The lamination films of metal were etched by using an etching solution composed of a mixed aqueous solution of phosphoric acid, acetic acid and nitric acid, and the resist was peeled off, whereby an inner side pattern 30a and a connection terminal side pattern 30b were formed to provide the supplementary wires 30. As the resist, a phenol novolack resin was used, and as the resist parting agent, monoethanolamine was used. Then, a pattern of insulation film 40 having apertures 40a for pixels was obtained. This pattern of insulation film 40 is provided on the patterned supplementary wires 30 to form supplementary wire contact portions 40b, as shown in FIG. 6.

An aperture for a pixel was of 300 μm×300 μm and a contact portion 40b between a cathode and a supplementary wire was of 200 μm×200 μm. Thereafter, a cathode separating pattern 50 was obtained. Then, irradiation of oxygen plasma was carried out by using a parallel plate type RF plasma device to modify the surface of the ITO film, and an organic EL layer and cathodes were formed by vacuum deposition through a mask by using a vacuum deposition device. Specifically, plasma processing of RIE (reactive ion etching) mode was carried out for 60 sec under the plasma process conditions of a flow rate of oxygen of 50 sccm (50 mL/min in a standard state), a total gas pressure of 6.7 Pa and 1.5 kW.

Then, an interface layer composed of copper phtalocyanine (hereinbelow, referred to as CuPc), a hole transport layer composed of N,N'-di(naphthalene-1-yl)-N,N'-diphenyl-benzidine (hereinbelow, referred to as α-NPD), a light emitting layer composed of tris(8-quinolinolato)aluminum (hereinbelow, abbreviated as Alq), an electron implanting layer composed of LiF and cathodes of Al were formed to have 10 nm, 60 nm, 50 nm, 0.5 nm and 200 nm, respectively.

Among these, the interface layer of CuPc, the hole transport layer of A-NPD, light emitting layer of Alq and the electron implanting layer of LIF constitute the organic EL layer. With respect to the hole transport layer, a triphenylamine type material such as triphenyldiamine (hereinbelow, referred to as TPD) can be used instead of α-NPD.

Then, an organic EL pattern 60 comprising the organic EL layer and a pattern of cathodes 70 were formed. Thereafter, the organic EL display element was bonded to a counter substrate 80 with a peripheral seal 90 comprising the ultra-violet curing type resin. Specifically, a film containing CaO as a hydroscopic agent 100 was attached to the counter substrate and the ultraviolet curing type resin was applied to a peripheral portion of the organic EL display element by using a dispenser. These two substrates were bonded mutually by irradiating ultraviolet rays. As the ultraviolet curing type resin, Nagase-Chiba XNR5516 was used.

Then, an anisotropic conductive film is bonded to the terminal portion, and TCP is connected to the terminal portion via the film. Specifically, the anisotropic conductive film 110 was bonded temporarily to the mounted terminal portion. As the anisotropic conductive film, Anisolm 7106U manufactured by Hitachi Chemical Co., Ltd. is usable, for example. The temperature for temporarily bonding is 80° C., the pressing pressure is 1.0 MPa and the pressing time is 5 sec.

Then, TCP including a driving circuit is bonded permanently to the connection terminal portion. The temperature for permanently bonding is 170° C., the pressing pressure is 2.0 MPa and the pressing time is 20 sec. Thus prepared organic EL display element has supplementary wires of low resistance and low contact resistance and terminals having excellent humidity resistance.

For the laminate according to the present invention, TEG using a metal film was prepared in the same manner as mentioned above. The wire resistance was 0.14 Ω/□. Further, the sheet resistance at the sputtering was 0.11 Ω/□. The contact resistance obtained from the contact TEG was 0.5 to 0.8 Ω/200 μm□, and the metal pattern was burned down at about 350 mA.

Figure 15:
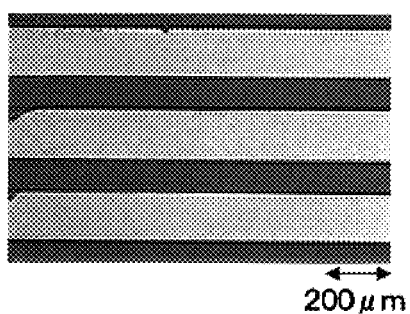
FIG. 15 is a photograph after evaluation to high temperature and high humidity of a terminal portion of the organic EL display element obtained in Example B4.
Figure 16:
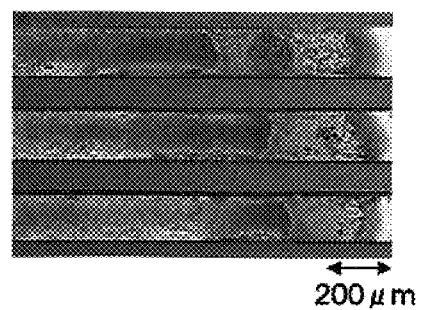
FIG. 16 is a photograph after evaluation to high temperature and high humidity of a terminal portion of the organic EL display element as a Comparative Example in Example B4.

Further, the terminal portion without mounting on the substrate of this Example was kept under high temperature/high humidity conditions of 80° C. and 90% RH. As Comparative Examples, terminal portions made of metal of MoNb (10 atom %) and Al, MoNb (10 atom %) were evaluated as well as the above. In this case, the film thickness of MoNb was 70 nm and the film thickness of Al was 350 nm. FIGS. 15 and 16 show states of corrosion after 100 hours. FIG. 15 shows the pattern of lamination films of this Example and FIG. 16 shows the lamination films formed by MoNb and Al.

Thus, it is understood that in the case of using the lamination film according to the present invention, the degree of corrosion can be reduced in comparison with the case of using MoNb as the capping film. Further, when the mounted terminal portion was observed after 700 hours by removing mounted FPC and ACF. As a result, the degree of corrosion could further be reduced.

This suggests that the NiMo alloy as the capping layer has excellent anti-corrosion characteristics. Further, when a pattern of the laminated metals is formed, Mo in the anti-Ni-diffusion layer exposes at an end of the pattern. When the Mo is replaced by a metal having improved anti-corrosion characteristics like MoNb, the diffusion of Ni into Al can be prevented, and corrosion can be suppressed.

Thus, by using the laminate of the present invention, it is possible to form a useful substrate with wires having a low resistance, being excellent in patterning performance and having a high humidity resistance. Further, a display of high performance and reliability can be prepared. In particular, the present invention is useful for an organic EL display element having a long lifetime and being expected for low-resistivitization of wires in order to improve light emitting characteristics.

TABLE 1

| Reference Example | Composition of target (mass %) | Film thickness (nm) | Sheet resistance (Ω/□) | Etching rate (nm/sec) | Humidity resistance (1) |
|---|---|---|---|---|---|
| 1 | Ni | 200 | 0.44 | X | ○ |
| 2 | 72.5Ni—24.5Mo—3Fe | 118 | 10 | 0.7 | ○ |
| 3 | 65Ni—32Mo—3Fe | 114 | 11 | 1.8 | ○ |
| 4 | Mo | 200 | 0.75 | 6.7 | X |
| 5 | Al | 167 | 0.27 | 1.5 | ○ |

TABLE 2

| Example | Substrate structure | Film structure | Film thickness (nm) | Humidity resistance (1) | Sheet resistance before heat treatment (Ω/□) | Heat resistance |
|---|---|---|---|---|---|---|
| 1 | Glass/SiO$_2$ | Al/Mo | 200/20 | ○ | 0.24 | ○ |
| 2 | Glass/SiO$_2$ | Al/NiMo | 200/20 | ○ | 0.24 | Δ |
| 3 | Glass/SiO$_2$/ITO | NiMo/Al/NiMo | 20/200/20 | ○ | 0.22 | X |
| 4 | Glass/SiO$_2$/ITO | NiMo/Mo/Al/Mo/NiMo | 20/10/200/10/20 | ○ | 0.22 | ○ |
| 5 | Glass/SiO$_2$/ITO | NiMo/Mo/Al/Mo/NiMo | 20/20/200/20/20 | ○ | 0.20 | ○ |
| 6 | Glass/SiO$_2$/ITO | NiMo/Mo/Al/Mo/NiMo | 20/30/200/30/20 | ○ | 0.21 | ○ |
| 7 | Glass/SiO$_2$/ITO | NiMo/Mo/Al/Mo/NiMo | 20/50/200/50/20 | ○ | 0.19 | ○ |

TABLE 3

| Example | Substrate structure | Film structure | Film thickness (nm) | Proportion of supplied sputtering gas in the formation of underlayer (Ni—Mo layer) and capping layer (Ni—Mo layer) | | | Humidity resistance (1) | Sheet resistance before heat treatment (Ω/□) | Heat resistance |
|---|---|---|---|---|---|---|---|---|---|
| | | | | Ar | N$_2$ | CO$_2$ | | | |
| 3 | Glass/SiO$_2$/ITO | NiMo/Al/NiMo | 20/200/20 | 100 | 0 | 0 | ○ | 0.22 | X |
| 8 | Glass/SiO$_2$/ITO | NiMo/Al/NiMo | 20/200/20 | 90 | 10 | 0 | ○ | 0.21 | Δ |
| 9 | Glass/SiO$_2$/ITO | NiMo/Al/NiMo | 20/200/20 | 79 | 21 | 0 | ○ | 0.23 | ○ |
| 10 | Glass/SiO$_2$/ITO | NiMo/Al/NiMo | 20/200/20 | 90 | 0 | 10 | ○ | 0.23 | Δ |
| 11 | Glass/SiO$_2$/ITO | NiMo/Al/NiMo | 20/200/20 | 66 | 0 | 34 | ○ | 0.23 | ○ |

TABLE 4

| Example | Substrate structure | Film structure | Film thickness (nm) | Proportion of supplied sputtering gas in the formation of underlayer (Ni—Mo layer) | | | Proportion of supplied sputtering gas in the formation of capping layer (Ni—Mo layer) | | | Sheet resistance before heat treatment (Ω/□) | Heat resistance | Feasibility of patterning | Humidity resistance (2) |
|---|---|---|---|---|---|---|---|---|---|---|---|---|---|
| | | | | Ar | N₂ | CO₂ | Ar | N₂ | CO₂ | | | | |
| 12 | Glass/SiO₂/ITO | NiMo/Mo/Al/Mo/NiMo | 20/20/200/20/20 | 100 | 0 | 0 | 100 | 0 | 0 | 0.22 | ○ | ○ | ○ |
| 13 | Glass/SiO₂/ITO | NiMo/Al/Mo/NiMo | 20/200/20/20 | 66 | 0 | 34 | 100 | 0 | 0 | 0.22 | ○ | ○ | ○ |
| 14 | Glass/SiO₂/ITO | NiMo/Al/NiMo | 20/200/20 | 66 | 0 | 34 | 79 | 21 | 0 | 0.23 | ○ | ○ | ○ |
| 15 | Glass/SiO₂/ITO | Mo/Al/Mo | 20/200/20 | 100 | — | — | 100 | — | — | 0.22 | ○ | ○ | X |

TABLE 5

| Example | Substrate structure | Film structure | Film thickness (nm) | Proportion of supplied sputtering gas in the formation of underlayer (Ni—Mo layer) | | | Proportion of supplied sputtering gas in the formation of capping layer (Ni—Mo layer) | | | Sheet resistance before heat treatment (Ω/□) | Heat resistance | Feasibility of patterning | Humidity resistance (2) | Humidity resistance (3) |
|---|---|---|---|---|---|---|---|---|---|---|---|---|---|---|
| | | | | Ar | N₂ | CO₂ | Ar | N₂ | CO₂ | | | | | |
| 13 | Glass/SiO₂/ITO | NiMo/Al/Mo/NiMo | 20/200/20/20 | 66 | 0 | 34 | 100 | 0 | 0 | 0.22 | ○ | ○ | ○ | Δ |
| 16 | Glass/SiO₂/ITO | NiMo/Al/NiMo | 20/200/20 | 66 | 0 | 34 | 100 | 0 | 0 | 0.22 | Δ | ○ | ○ | ○ |
| 17 | Glass/SiO₂/ITO | NiMo/Al/Mo—5Nb/NiMo | 20/200/20/20 | 66 | 0 | 34 | 100 | 0 | 0 | 0.22 | ○ | ○ | ○ | ○ |
| 18 | Glass/SiO₂/ITO | NiMo/Al/Mo—10Nb/NiMo | 20/200/20/20 | 66 | 0 | 34 | 100 | 0 | 0 | 0.22 | ○ | ○ | ○ | ○ |
| 19 | Glass/SiO₂/ITO | NiMo/Al/Mo/NiMo | 20/200/20/20 | 66 | 0 | 34 | 100 | 0 | 0 | 0.20 | ○ | ○ | ○ | ○ |

What is claimed is:

1. A laminate comprising:
a substrate,
a first conductive layer that comprises Al or an Al alloy as the major component present on said substrate;
a capping layer that comprises a Ni—Mo alloy as the major component present on said first conductive layer;
an ITO layer present on said substrate; and
an underlayer present on said ITO layer.

2. The laminate according to claim 1, wherein the underlayer comprises Mo or a Mo alloy as the major component.

3. The laminate according to claim 2, wherein the underlayer comprises Ni by 20–90 mass % of all components, and the underlayer comprises Mo by 10–80 mass % of all components.

4. The laminate according to claim 1, wherein the underlayer comprises Ni—Mo as the major component and the underlayer comprises at least one member selected from the group consisting of (1) oxygen, (2) nitrogen, (3) oxygen and nitrogen, (4) oxygen and carbon, and (5) oxygen, nitrogen, and carbon.

5. The laminate according to claim 1, wherein the capping layer comprises at least one member selected from the group consisting of (1) oxygen, (2) nitrogen, (3) oxygen and nitrogen, (4) oxygen and carbon, and (5) oxygen, nitrogen, and carbon.

6. The laminate according to claim 1, wherein the capping layer comprises Ni by 20–90 mass % based on all the components, and
wherein the capping layer comprises Mo by 10–80 mass % based on all the components.

7. An organic EL display element comprising:
a laminate described in claim 1,
wherein a second electrode layer is present between the substrate and a first electrode layer,
wherein an organic EL layer is disposed between the first electrode layer and the second electrode layer, and
wherein the substrate, the first conductive layer, and the capping layer are arranged in an order starting from the substrate.

8. A method for producing the laminate described in claim 1, the method comprising:
forming the first conductive layer on the substrate; and
forming the capping layer on
the first conductive layer.

9. The method for producing the laminate according to claim 8, the method comprising:
forming a transparent second conductive layer,
patterning the formed transparent second conductive layer;
forming the first conductive layer on the transparent second conductive layer.

10. The method for producing the laminate according to claim 8, wherein forming the capping layer is formed by one or more processes of (1) oxidizing, (2) nitriding, (3) oxidizing and nitriding, (4) oxidizing and carbonizing, (5) nitriding and carbonizing, and (5) oxidizing, nitriding, and carbonizing.

11. A substrate comprising:
the laminate described in claim 1, and
wires,
wherein the laminate is patterned in a flat form.

12. A laminate comprising:
substrate,
a first conductive layer that comprises Al or an Al alloy as the major component present on said substrate; and
a capping layer that comprises a Ni—Mo alloy as the major component present on said first conductive layer, wherein an anti-Ni-diffusion layer without containing Ni is present between the first conductive layer and the capping layer.

13. The laminate according to claim 12, wherein the anti-Ni-diffusion layer comprises Mo as the major component and does not contain Ni.

14. The laminate according to claim 13, wherein the anti-Ni-diffusion layer comprises MoNb, MoTa, MoV, or MoW.

15. The laminate according to claim 13, wherein a conductive material in the anti-Ni-diffusion layer comprises Mo, Nb, or Ta,
wherein, if Mo is present, the anti-Ni-diffusion layer comprises 80–98 mass % of Mo, and
wherein, if Nb or Ta is present, the anti-Ni-diffusion layer comprises 2–20 mass % of Nb or Ta.

16. An organic EL display element comprising:
a first electrode layer; and
a second electrode layer present between the first electrode layer and a substrate;
an organic EL layer disposed between the first electrode layer and the second electrode layer,
wherein a first conductive layer is connected electrically to the first electrode layer,
wherein a capping layer is present on an upper side of the first conductive layer,
wherein the first conductive layer comprises Al or an Al alloy as the major component,
wherein the capping layer comprises a Ni—Mo alloy as the major component; and
an anti-Ni-diffusion layer which does not contain Ni, and is present between the first conductive layer and the capping layer.

17. The organic EL display element according to claim 16, wherein the capping layer comprises at least one member selected from the group consisting of (1) oxygen, (2) nitrogen, (3) oxygen and nitrogen, (4) oxygen and carbon, and (5) oxygen, nitrogen, and carbon.

18. The organic EL display element according to claim 16, wherein the anti-Ni-diffusion layer comprises MoNb, MoTa, MoV, or MoW.

19. The organic EL display element according to claim 16, further comprising an underlayer that comprises Mo or a Mo alloy present under the first conductive layer.

20. The organic EL display element according to claim 16, wherein the second electrode layer is an ITO layer.

21. A method for producing the organic EL display element described in claim 16, the method comprising:
forming a transparent second conductive layer on the substrate,
forming a lamination layer comprising a first conductive layer and a capping layer on the substrate,
employing the second conductive layer as a second electrode; and
patterning the lamination layer so that the lamination layer is used as a part of wires extending from the first conductive layer to a connection terminal.

22. The method for producing the organic EL display element according to claim 21, the method comprising:
forming the transparent second conductive layer on the substrate,
patterning the second conductive layer to use as the second electrode,
forming the first conductive layer and the capping layer as the lamination layer, and
patterning the lamination layer.

23. An organic EL display element comprising:
the organic EL display element described in claim 16; and
a driving circuit connected to the display element so that a display has a luminance of at least 100 cd/m$^2$.

24. A connection terminal for an organic EL display element, to connect a first electrode layer present on the substrate for the organic EL display element to a driving circuit, the connection terminal comprising:
a first conductive layer that comprises Al or an Al alloy as the major component;
a capping layer that comprises a Ni—Mo alloy as the major component,
wherein said capping layer is present at an upper side of the first conductive layer,
wherein a circuit supplies an electric current from the driving circuit to the first electrode layer; and
an anti-Ni-diffusion layer without containing Ni is present between the first conductive layer and the capping layer.

25. The connection terminal for an organic EL display element according to claim 24, wherein the capping layer comprises at least one member selected from the group consisting of (1) oxygen, (2) nitrogen, (3) oxygen and nitrogen, (4) oxygen and carbon, and (5) oxygen, nitrogen, and carbon.

26. The connection terminal for an organic EL display element according to claim 24, wherein the circuit supplies an electric current from a plurality of second electrodes to a single first electrode, and the maximum instantaneous current flowing into the single first electrode is at least 50 mA.

27. A method for producing the connection terminal for an organic EL display element, described in claim 24, the method comprising:
forming a transparent second conductive layer;
patterning the formed transparent second conductive layer;
forming a lamination layer comprising the first conductive layer and the capping layer, and
patterning the lamination layer.

* * * * *